US011166386B2

(12) United States Patent
Yonemori et al.

(10) Patent No.: US 11,166,386 B2
(45) Date of Patent: Nov. 2, 2021

(54) INTERPOSER SUBSTRATE, CIRCUIT MODULE, AND INTERPOSER SUBSTRATE MANUFACTURING METHOD

(71) Applicant: Murata Manufacturing Co., Ltd., Nagaokakyo (JP)

(72) Inventors: Keito Yonemori, Nagaokakyo (JP); Hirokazu Yazaki, Nagaokakyo (JP); Takanori Tsuchiya, Nagaokakyo (JP); Koji Kamada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 129 days.

(21) Appl. No.: 16/522,704

(22) Filed: Jul. 26, 2019

(65) Prior Publication Data

US 2019/0350090 A1    Nov. 14, 2019

Related U.S. Application Data

(63) Continuation of application No. PCT/JP2017/042935, filed on Nov. 30, 2017.

(30) Foreign Application Priority Data

Jan. 27, 2017   (JP) .............................. JP2017-012765

(51) Int. Cl.
*H05K 1/18*         (2006.01)
*H05K 3/46*         (2006.01)
(Continued)

(52) U.S. Cl.
CPC ................. *H05K 3/46* (2013.01); *H05K 1/14* (2013.01); *H05K 1/18* (2013.01); *H01B 7/08* (2013.01);
(Continued)

(58) Field of Classification Search
CPC .. H05K 3/46; H05K 1/14; H05K 1/18; H05K 3/4629; H05K 1/0306; H05K 2201/086;
(Continued)

(56) References Cited

U.S. PATENT DOCUMENTS 6,426,551 B1 *  7/2002  Kawakami .............. C03C 3/062
                                                         257/700
6,875,526 B2 *  4/2005  Umemoto ............... H01F 41/16
                                                         174/258
(Continued)

FOREIGN PATENT DOCUMENTS

JP      2003-282785 A       10/2003
JP      2003282785      *   10/2003
(Continued)

OTHER PUBLICATIONS

Official Communication issued in International Patent Application No. PCT/JP2017/042935, dated Feb. 27, 2018.

*Primary Examiner* — Yuriy Semenenko
(74) *Attorney, Agent, or Firm* — Keating & Bennett, LLP

(57) ABSTRACT

An interposer substrate includes a dielectric portion, a magnetic portion, and a first principal surface and a second principal surface opposite to each other. Connection terminal electrodes are each provided on a corresponding one of first principal surfaces of the dielectric portion and the magnetic portion, and are connected to a cable. Circuit-board terminal electrodes are provided on a second principal surface of the dielectric portion and connected to a circuit board. Wiring electrodes are provided inside a base body, and connecting the connection terminal electrodes to the circuit-board terminal electrodes in a predetermined connection pattern. The wiring electrodes include a first wiring electrode passing through only the dielectric portion, and a second wiring electrode passing through the magnetic portion.

19 Claims, 19 Drawing Sheets

(51) Int. Cl.
*H05K 1/14* (2006.01)
*H01B 7/08* (2006.01)
*H01F 17/00* (2006.01)
*H01F 27/06* (2006.01)
*H01R 43/02* (2006.01)

(52) U.S. Cl.
CPC .... *H01F 17/0013* (2013.01); *H01F 2027/065* (2013.01); *H01R 43/02* (2013.01)

(58) Field of Classification Search
CPC ......... H05K 2201/10378; H05K 1/165; H01B 7/08; H01F 17/0013; H01F 2027/065; H01F 2017/002; H01R 43/02
See application file for complete search history.

(56) References Cited

U.S. PATENT DOCUMENTS

| | | | |
|---|---|---|---|
| 7,595,997 B2 * | 9/2009 | Nomiya | H01L 23/49822 361/742 |
| 8,207,811 B2 * | 6/2012 | Mano | H01L 23/645 336/200 |
| 2004/0184219 A1 * | 9/2004 | Otsuka | H01L 23/49816 361/306.3 |
| 2014/0003007 A1 | 1/2014 | Shiroki et al. | |
| 2014/0225702 A1 * | 8/2014 | Yazaki | H01F 17/0013 336/200 |
| 2015/0082629 A1 * | 3/2015 | Kato | H05K 1/148 29/860 |

FOREIGN PATENT DOCUMENTS

| | | |
|---|---|---|
| JP | 2008-140941 A | 6/2008 |
| JP | 2009-218258 A | 9/2009 |
| JP | 2003282785 * | 10/2013 |
| JP | 2015-144165 A | 8/2015 |
| JP | 5842850 B2 | 1/2016 |
| WO | 2014/002757 A1 | 1/2014 |

* cited by examiner

INTERPOSER SUBSTRATE, CIRCUIT MODULE, AND INTERPOSER SUBSTRATE MANUFACTURING METHOD

CROSS REFERENCE TO RELATED APPLICATIONS

This application claims the benefit of priority to Japanese Patent Application No. 2017-012765 filed on Jan. 27, 2017 and is a Continuation Application of PCT Application No. PCT/JP2017/042935 filed on Nov. 30, 2017. The entire contents of each application are hereby incorporated herein by reference.

BACKGROUND OF THE INVENTION

1. Field of the Invention

The present invention relates to an interposer substrate used to connect a circuit board to another circuit member, and to a circuit module including the interposer substrate.

2. Description of the Related Art

As described in Japanese Patent No. 5842850, for example, a cellular communication terminal includes a plurality of circuit boards arranged in a housing. To connect these circuit boards, a flat cable, which is an example of another circuit member, may be used.

The flat cable described in Japanese Patent No. 5842850 includes connector members as external terminals. The connector members of the flat cable are mated with connector members mounted on the circuit boards. This configuration enables connection of the flat cable to the circuit boards.

In a configuration described in International Publication No. 2014/002757, a guide member is mounted on a circuit board, and external terminals of a flat cable are joined to the guide member.

A circuit module that includes a circuit board and a cable, such as those described above, may include a predetermined circuit element, such as a ferrite bead element, to improve noise performance of the circuit module.

The configurations described in Japanese Patent No. 5842850 and International Publication No. 2014/002757 require mounting of a predetermined circuit element, such as a ferrite bead element, around a cable mount position on the circuit board. This may interfere with the effective use of space to surface mount on the circuit board, and may make it difficult to reduce the size of the circuit board and the circuit module.

SUMMARY OF THE INVENTION

Preferred embodiments of the present invention provide interposer substrates that each connect a cable and a circuit board, and do not require mounting of a predetermined circuit element, such as a ferrite bead element, on the circuit board to which the cable is connected.

An interposer substrate according to a preferred embodiment of the present invention includes a base body, a plurality of connection terminal electrodes, a plurality of circuit-board terminal electrodes, and a plurality of wiring electrodes. The base body includes a dielectric portion and a magnetic portion, and includes a first principal surface and a second principal surface opposite each other. The plurality of connection terminal electrodes are provided on the first principal surface of the base body and connected to a cable. The plurality of circuit-board terminal electrodes are provided on the second principal surface of the base body and connected to a circuit board. The plurality of wiring electrodes are provided inside the base body and connect the plurality of connection terminal electrodes to the plurality of circuit-board terminal electrodes in a predetermined connection pattern. The plurality of wiring electrodes include a first wiring electrode passing through only the dielectric portion, and a second wiring electrode passing through the magnetic portion.

In this configuration, the second wiring electrode, which passes through the magnetic portion, defines and functions as a predetermined circuit element, such as a ferrite bead element, a choke coil, or a noise filter. On the other hand, the first wiring electrode, which does not pass through the magnetic portion, defines and functions, for example, as a transmission line to transmit high-frequency signals with low loss. Since these portions are combined to define the base body, there is no need to externally provide the circuit element described above.

An interposer substrate according to a preferred embodiment of the present invention may be configured as follows. The dielectric portion includes a recess recessed from the first principal surface. The magnetic portion is mounted in the recess. The plurality of connection terminal electrodes include a first connection terminal electrode connected to the first wiring electrode, and a second connection terminal electrode connected to the second wiring electrode. The first connection terminal electrode and the second connection terminal electrode are flush or substantially flush with each other on the first principal surface of the base body.

This configuration facilitates manufacturing, because the interposer substrate is able to be made by separately forming the dielectric portion and the magnetic portion and combining them. Also, this configuration provides a flat surface to join to the cable, and facilitates joining of the cable.

An interposer substrate according to a preferred embodiment of the present invention may be configured as follows. The dielectric portion includes a recess recessed from the second principal surface. The magnetic portion is mounted in the recess. The plurality of connection terminal electrodes include a first connection terminal electrode connected to the first wiring electrode and a second connection terminal electrode connected to the second wiring electrode. The first connection terminal electrode includes a plurality of high-frequency signal terminal electrodes, and an auxiliary terminal electrode disposed along a periphery of the base body and closer to the periphery than the plurality of high-frequency signal terminal electrodes are.

In this configuration, the auxiliary terminal electrode improves joint strength between the interposer substrate and the cable. The auxiliary terminal electrode is able to be easily provided because, in this configuration, the base body includes the dielectric portion alone on the side of the first principal surface.

In an interposer substrate according to a preferred embodiment of the present invention, the recess is preferably filled with an insulating resin portion.

This configuration improves joint strength between the magnetic portion and the dielectric portion and improves reliability.

An interposer substrate according to a preferred embodiment of the present invention is preferably configured as follows. The dielectric portion includes a plurality of dielectric ceramic layers that are stacked, and the magnetic portion includes a plurality of magnetic ceramic layers that are stacked.

With this configuration, the magnetic portion and the dielectric portion are each easily configured in a predetermined shape.

In an interposer substrate according to a preferred embodiment of the present invention, in the second wiring electrode, an electrode provided inside the magnetic portion may have a predetermined coil pattern.

This configuration improves operational effects achieved by the second wiring electrode.

An interposer substrate according to a preferred embodiment of the present invention may be configured as follows. The magnetic portion includes a plurality of second wiring electrodes. At least one of the plurality of second wiring electrodes has an impedance different from those of the others of the plurality of second wiring electrodes. End portions of the plurality of second wiring electrodes are rotationally symmetrically arranged as viewed from the first principal surface or the second principal surface.

In this configuration, rotating the arrangement of the magnetic portion changes the electrical connection pattern. It is thus possible to change the electrical connection pattern without changing the physical connection pattern.

An interposer substrate according to a preferred embodiment of the present invention may be configured as follows. At least one of the first wiring electrode and the plurality of second wiring electrodes has a different impedance. An end portion of the first wiring electrode and the end portions of the plurality of second wiring electrodes are rotationally symmetrically arranged as viewed from the first principal surface or the second principal surface.

In this configuration, rotating the arrangement of the interposer substrate with respect to the circuit board changes the electrical connection pattern. It is thus possible to change the electrical connection pattern without changing the physical connection pattern.

An interposer substrate according to a preferred embodiment of the present invention may be configured as follows. The dielectric portion includes a recess recessed from the first principal surface. The interposer substrate further includes a columnar element including a terminal electrode and shaped to be disposed in the recess. The columnar element defines at least one of the dielectric portion and the magnetic portion.

With this configuration, changing the type of the columnar element enables the electrical connection pattern to be changed without changing the physical connection pattern.

An interposer substrate according to a preferred embodiment of the present invention may be configured as follows. The terminal electrode of the columnar element is exposed from the first principal surface of the base body, and flush or substantially flush with the first principal surface.

With this configuration, the terminal electrode of the columnar element is able to be used as a connection terminal electrode of the interposer substrate.

An interposer substrate according to a preferred embodiment of the present invention may be configured as follows. The interposer substrate further includes a cover covering the first principal surface of the base body. The cover includes a cover connecting electrode to connect the first wiring electrode and the terminal electrode of the columnar element to an external unit.

With this configuration, the columnar element is reliably secured in place by the cover.

An interposer substrate according to a preferred embodiment of the present invention may be configured as follows. The cover connecting electrode includes an inner terminal electrode provided on a surface of the cover adjacent to the base body and connected to the terminal electrode of the columnar element, and an outer terminal electrode connected to the inner terminal electrode and provided on a surface of the cover opposite the base body.

With this configuration, which represents a specific structure of the cover, the columnar element is reliably secured in place and electrically connected on the side thereof adjacent to the first principal surface of the interposer substrate.

An interposer substrate according to a preferred embodiment of the present invention may be configured as follows. The cover includes a through hole overlapping the recess. The columnar element is inserted in the through hole.

With this configuration, the columnar element is able to be easily modified from the first principal surface of the interposer substrate.

An interposer substrate according to a preferred embodiment of the present invention may be configured as follows. The recess includes, on a bottom surface thereof, a terminal electrode. The terminal electrode is connected to a circuit-board terminal electrode provided on the second principal surface of the base body and overlapping the recess in plan view. A terminal electrode of the columnar element disposed adjacent to the second principal surface is connected to the terminal electrode.

With this configuration, the columnar element is reliably secured inside the recess and electrically connected.

An interposer substrate according to a preferred embodiment of the present invention may be configured as follows. The recess passes through the base body, and a terminal electrode of the columnar element disposed adjacent to the second principal surface is exposed from the second principal surface.

With this configuration, the columnar element is able to be easily modified from the second principal surface of the interposer substrate.

An interposer substrate according to a preferred embodiment of the present invention is preferably configured as follows. The interposer substrate further includes a shield film provided on a periphery of the base body to cover at least a portion of the periphery. The periphery connects the first principal surface to the second principal surface.

This configuration reduces emission of noise generated inside the interposer substrate.

In an interposer substrate according to a preferred embodiment of the present invention, the shield film is preferably continuously provided on the periphery along the entire or substantially the entire perimeter.

This configuration improves the noise shielding effect.

A circuit module according to a preferred embodiment of the present invention includes any of the interposer substrates described above, a cable, and a circuit board. The cable includes a plurality of external terminal electrodes joined to the plurality of connection terminal electrodes. The circuit board includes a plurality of land electrodes joined to the plurality of circuit-board terminal electrodes.

With this configuration, there is no need to mount a predetermined circuit element, such as a ferrite bead element, on the circuit board.

In a circuit module according to a preferred embodiment of the present invention, of the plurality of external terminal electrodes, an external terminal electrode connected to the first wiring electrode is for high-frequency signals or for grounding, and an external terminal electrode connected to the second wiring electrode is for low-frequency signals.

With this configuration, high-frequency signals are transmitted with low loss, and noise on low-frequency signals is effectively reduced.

A circuit module according to a preferred embodiment of the present invention includes the interposer substrate including the shield film described above, a first circuit member, a circuit board, and a surface-mount electronic component. The first circuit member includes a plurality of external terminal electrodes joined to the plurality of connection terminal electrodes. The circuit board includes a plurality of land electrodes joined to the plurality of circuit-board terminal electrodes. The surface-mount electronic component is mounted on the circuit board. A height of the shield film is preferably greater than a height of the surface-mount electronic component.

This configuration reduces emission of noise from the interposer substrate to the surface-mount electronic component, and also reduces leakage of noise in a direction opposite to the emission.

An interposer substrate manufacturing method according to a preferred embodiment of the present invention includes the following steps. The manufacturing method includes the steps of forming a dielectric portion by stacking a plurality of dielectric ceramic layers, the dielectric portion including a first principal surface and a second principal surface opposite each other, the dielectric portion including a recess recessed from the first principal surface; and forming a magnetic portion including a plurality of magnetic ceramic layers stacked together. The manufacturing method includes the steps of forming a plurality of first columnar electrodes on the first principal surface of the dielectric portion, mounting the magnetic portion in the recess, and forming a plurality of second columnar electrodes on a side of the magnetic portion adjacent to the first principal surface. The manufacturing method includes the steps of forming an insulating resin portion to cover the magnetic portion, the plurality of first columnar electrodes, and the plurality of second columnar electrodes from a side of the first principal surface; and exposing the plurality of first columnar electrodes and the plurality of second columnar electrodes to an outside of the first principal surface by grinding at least the insulating resin portion.

This manufacturing method facilitates manufacture of the interposer substrate in which the dielectric portion and the magnetic portion are combined together, and improves flatness of the surface adjacent to the first principal surface where a plurality of electrodes are exposed (i.e., flatness of the surface to which a cable is joined).

With preferred embodiments of the present invention, there is no need to mount a predetermined circuit element, such as a ferrite bead element, on the circuit board. This enables effective use of space for surface mounting on the circuit board, and facilitates size reduction of the circuit board and the circuit module.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

Figure 1A:
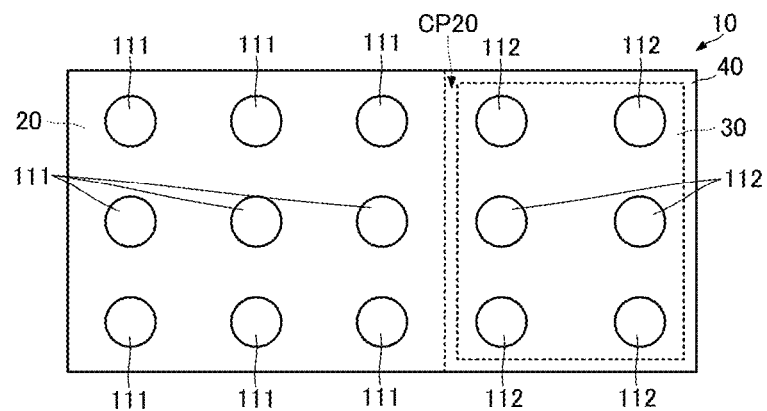
FIG. 1A is a plan view of an interposer substrate according to a first preferred embodiment of the present invention, as viewed from a first principal surface.
Figure 1B:
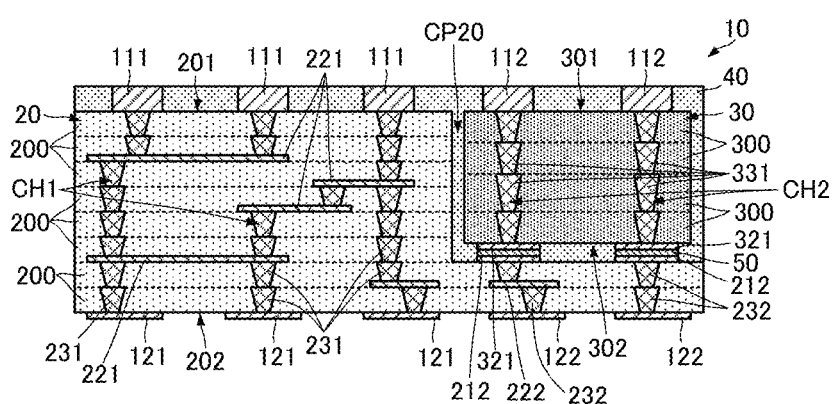
FIG. 1B is a lateral cross-sectional view illustrating a configuration of the interposer substrate.
Figure 1C:
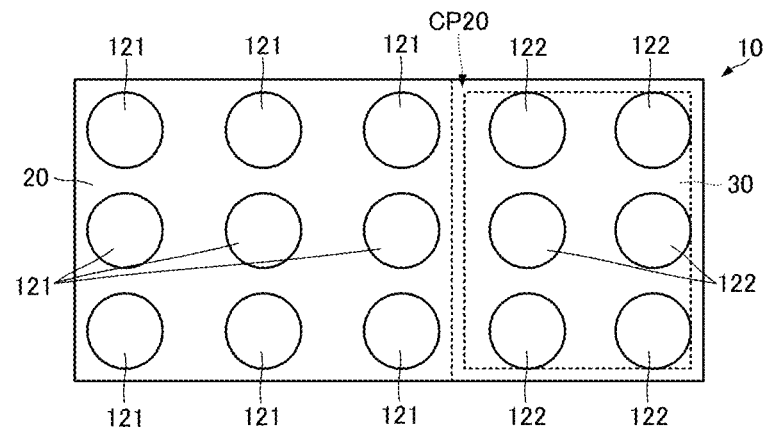
FIG. 1C is a plan view of the interposer substrate, as viewed from a second principal surface.

An interposer substrate according to a first preferred embodiment of the present invention, a circuit module, and an interposer substrate manufacturing method will now be described with reference to the drawings. FIG. 1A is a plan view of an interposer substrate according to the first preferred embodiment of the present invention, as viewed from a first principal surface. FIG. 1B is a lateral cross-sectional view illustrating a configuration of the interposer substrate. FIG. 1C is a plan view of the interposer substrate, as viewed from a second principal surface. For ease of viewing, some easily identifiable portions are not denoted in FIG. 1B.

As illustrated in FIGS. 1A to 1C, an interposer substrate 10 includes a dielectric portion 20, a magnetic portion 30, and an insulating resin portion 40. The dielectric portion 20 and the magnetic portion 30 are combined to define a base body of the interposer substrate 10.

The dielectric portion 20 includes a plurality of dielectric ceramic layers 200 that are stacked along a thickness direction. The dielectric portion 20 is preferably a non-magnetic portion, but may be made of a material with a magnetic permeability lower than that of the magnetic portion 30. The dielectric portion 20 includes a first principal surface 201 and a second principal surface 202. The first principal surface 201 and the second principal surface 202 are orthogonal or substantially orthogonal to the thickness direction of the dielectric portion 20. The area of the first principal surface 201 is smaller than the area of the second principal surface 202, and the first principal surface 201 is opposite to a portion of the second principal surface 202. That is, the dielectric portion 20 includes a recess CP20 recessed from the first principal surface 201 in the thickness direction.

The first principal surface 201 of the dielectric portion 20 includes a plurality of connection terminal electrodes 111 provided thereon. The second principal surface 202 of the dielectric portion 20 includes a plurality of circuit-board terminal electrodes 121 provided thereon. The plurality of circuit-board terminal electrodes 121 are preferably provided in a region of the second principal surface 202 opposite the first principal surface 201. The region where the plurality of circuit-board terminal electrodes 121 are provided is not limited to this, but it is preferable that the plurality of circuit-board terminal electrodes 121 are provided within this region.

The dielectric portion 20 includes planar electrodes 221 and 222 and connecting electrodes 231 and 232 provided therein. The planar electrodes 221 and 222 extend orthogonal or substantially orthogonal to the thickness direction of the dielectric portion 20, and the connecting electrodes 231 and 232 extend parallel or substantially parallel to the thickness direction.

The plurality of planar electrodes 221 and the plurality of connecting electrodes 231 are provided within a region between the first principal surface 201 and the second principal surface 202 opposite to each other, and are connected in a predetermined connection pattern. This produces a plurality of first wiring electrodes CH1. As illustrated in FIG. 1B, the plurality of connection terminal electrodes 111 and the plurality of circuit-board terminal electrodes 121 are connected in a predetermined connection pattern, with the plurality of first wiring electrodes CH1 interposed therebetween. Note that the predetermined connection pattern is a connection pattern determined in advance as a function of the interposer substrate 10.

A bottom surface of the recess CP20 of the dielectric portion 20 includes a plurality of magnetic-body mount electrodes 212 provided thereon. The plurality of circuit-board terminal electrodes 122 are provided in a region of the second principal surface 202 not opposite the first principal surface 201 (i.e., in a region including the recess CP20).

The planar electrode 222 and the plurality of connecting electrodes 232 are provided in a region of the dielectric portion 20 outside the region between the first principal surface 201 and the second principal surface 202 opposite to each other (i.e., provided in a region including the recess CP20), and are connected in a predetermined connection pattern. The plurality of magnetic-body mount electrodes 212 and the plurality of circuit-board terminal electrodes 121 are connected in this predetermined connection pattern.

The magnetic portion 30 includes a plurality of magnetic ceramic layers 300 that are stacked along the thickness direction. The magnetic portion 30 includes a principal surface 301 and a principal surface 302. The principal surface 301 and the principal surface 302 are orthogonal or substantially orthogonal to the thickness direction of the magnetic portion 30.

The principal surface 301 of the magnetic portion 30 includes a plurality of connection terminal electrodes 112 provided thereon. The principal surface 302 of the magnetic portion 30 includes a plurality of mount electrodes 321 provided thereon.

The magnetic portion 30 includes a plurality of connecting electrodes 331 provided therein. The plurality of connecting electrodes 331 extend parallel or substantially parallel to the thickness direction of the magnetic portion 30. As illustrated in FIG. 1B, the plurality of connection terminal electrodes 112 and the plurality of mount electrodes 321 are connected in a predetermined connection pattern, with the plurality of connecting electrodes 331 interposed therebetween. This produces a plurality of second wiring electrodes CH2.

The magnetic portion 30 is disposed inside the recess CP20 of the dielectric portion 20. The principal surface 301 of the magnetic portion 30 is flush or substantially flush with the first principal surface 201 of the dielectric portion 20. The plurality of connection terminal electrodes 112 are also flush or substantially flush with the plurality of connection terminal electrodes 111. This means that an outer surface adjacent to the first principal surface of the base body (i.e., a surface to which a flat cable is connected) is flat or substantially flat.

The plurality of mount electrodes 321 of the magnetic portion 30 are joined to the plurality of magnetic-body mount electrodes 212 of the dielectric portion 20, with solder 50, for example, interposed therebetween.

The recess CP20 of the dielectric portion 20 is filled with the insulating resin portion 40, which covers the magnetic portion 30. The insulating resin portion 40 preferably covers both of the first principal surface 201 of the dielectric portion 20 and the principal surface 301 of the magnetic portion 30, and allows only end surfaces of the plurality of connection terminal electrodes 111 and 112 to be exposed to the outside. The insulating resin portion 40 is optional, but adding the insulating resin portion 40 improves the joint strength between the dielectric portion 20 and the magnetic portion 30, and improves the reliability of the interposer substrate 10.

With this configuration, a transmission path passing through the first wiring electrodes CH1 and a transmission path passing through the second wiring electrodes CH2 are both provided in the single base body.

The second wiring electrodes CH2, which pass through the magnetic portion 30, provide a ferrite bead effect. The first wiring electrodes CH1, which do not pass through the magnetic portion 30 and are unaffected by ferrite beads, transmit high-frequency signals with low loss. The occurrence of parasitic inductance on the ground (ground potential) is also able to be reduced.

With the configuration described above, the interposer substrate 10 achieves low-loss transmission of high-frequency signals, reduction of parasitic inductance on the ground, and reduction of noise on low-frequency signals in one base body at the same time. That is, the interposer substrate 10 provides a structure that simultaneously achieves a signal transmission function and other functions using inductance.

This enables greater size reduction than with a configuration in which the interposer substrate and the circuit element, such as a ferrite bead element, are separately provided only for the purpose of signal transmission.

The high-frequency signals described above are preferably, for example, signals that use a frequency band higher than about 100 MHz, and the low-frequency signals described above are signals that use a frequency band lower than the high-frequency band, such as, for example, signals that use a frequency band lower than about 100 MHz. The definition of high and low frequencies is not limited to this, and high and low frequencies may be appropriately set within a range similar to the defined range, in accordance with the type of circuit module in which the interposer substrate 10 is used.

Figure 2:
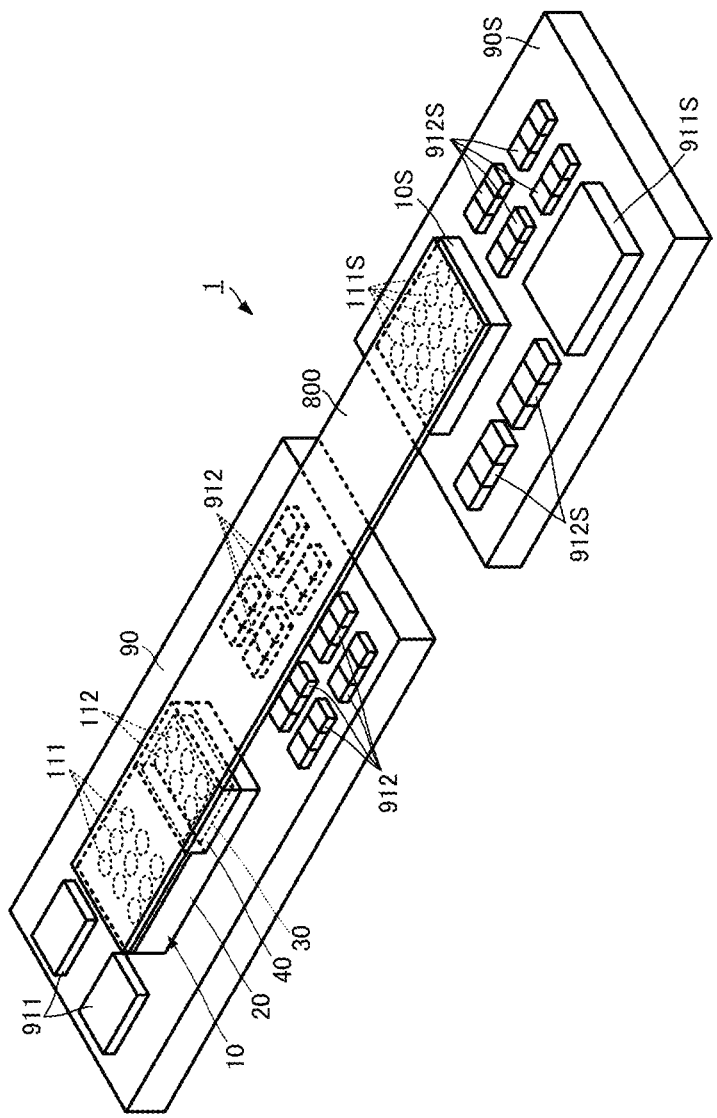
FIG. 2 is a perspective view illustrating a configuration of a circuit module including the interposer substrate according to the first preferred embodiment of the present invention.

The interposer substrate 10 configured as described above is used in a circuit module described below. FIG. 2 is a perspective view illustrating a configuration of a circuit module including the interposer substrate according to the first preferred embodiment.

As illustrated in FIG. 2, a circuit module 1 includes interposer substrates 10 and 10S, a flat cable 800, and circuit boards 90 and 90S.

The circuit board 90 and the circuit board 90S are spaced apart from each other. A plurality of surface-mount electronic components 911 and 912 are mounted on a surface of the circuit board 90 or, more specifically, on a plurality of land electrodes 901 on the surface of the circuit board 90. A surface of the circuit board 90S includes a plurality of surface-mount electronic components 911S and 912S mounted thereon.

The interposer substrate 10 is mounted on the surface of the circuit board 90. The interposer substrate 10S is mounted on the surface of the circuit board 90S. The flat cable 800 connects the plurality of connection terminal electrodes 111 and 112 of the interposer substrate 10 to a plurality of connection terminal electrodes 111S of the interposer substrate 10S. The circuit board 90 and the circuit board 90S are thus electrically connected by the interposer substrates 10 and 10S and the flat cable 800.

Figure 3:
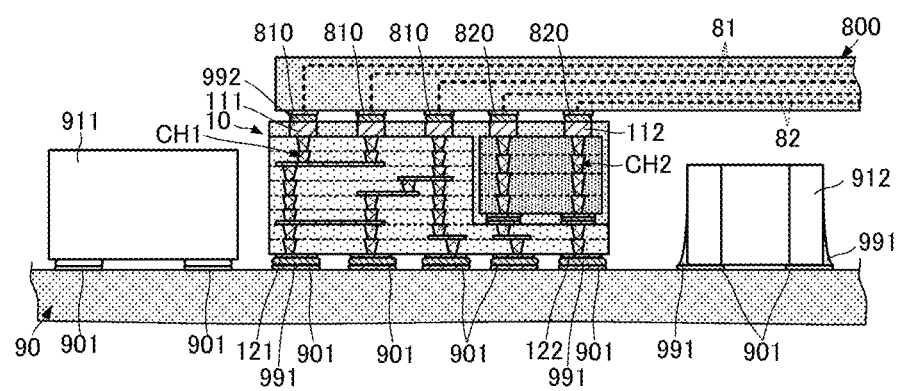
FIG. 3 is an enlarged lateral cross-sectional view of a configuration of a portion of the circuit module illustrated in FIG. 2.

A structure of how the interposer substrate 10, the flat cable 800, and the circuit board 90 are connected will now be more specifically described with reference to FIG. 3. FIG. 3 is an enlarged lateral cross-sectional view of a configuration of a portion of the circuit module illustrated in FIG. 2.

As illustrated in FIG. 3, the surface of the circuit board 90 includes the plurality of land electrodes 901 provided thereon. The plurality of circuit-board terminal electrodes 121 and 122 of the interposer substrate 10 are connected to corresponding ones of the land electrodes 901, with solder 991 interposed therebetween.

The flat cable 800 includes a plurality of external terminal electrodes 810 and 820 provided thereon. The plurality of connection terminal electrodes 111 of the interposer substrate 10 are connected to the respective external terminal electrodes 810, with solder 992 interposed therebetween. The plurality of connection terminal electrodes 112 of the interposer substrate 10 are connected to the respective external terminal electrodes 820, with the solder 992 interposed therebetween.

The plurality of external terminal electrodes 810 on the flat cable 800 are connected to a plurality of flat-cable wiring electrodes 81. The plurality of flat-cable wiring electrodes 81 are to transmit high-frequency signals, or are electrodes for the ground. The plurality of external terminal electrodes 820 are connected to a plurality of flat-cable wiring electrodes 82. The plurality of flat-cable wiring electrodes 82 are able to transmit low-frequency signals, such as electrodes to transmit control signals or direct-current power line electrodes.

With this configuration, the circuit module 1 enables the interposer substrate 10 to transmit high-frequency signals with low loss and reduce parasitic inductance on the ground. Additionally, the circuit module 1 enables the interposer substrate 10 to reduce noise components superimposed on low-frequency signals.

Also, the configuration eliminates the need to mount, for example, a ferrite bead element on the circuit board where the interposer substrate 10 is mounted. This enables effective use of space to surface mount on the circuit board, and facilitates size reduction of the circuit board 90 and the circuit module 1.

In the configuration described above, the interposer substrate 10 is preferably flat on the side thereof adjacent to the first principal surface. This improves joint reliability between the interposer substrate 10 and the flat cable 800.

Figure 4:
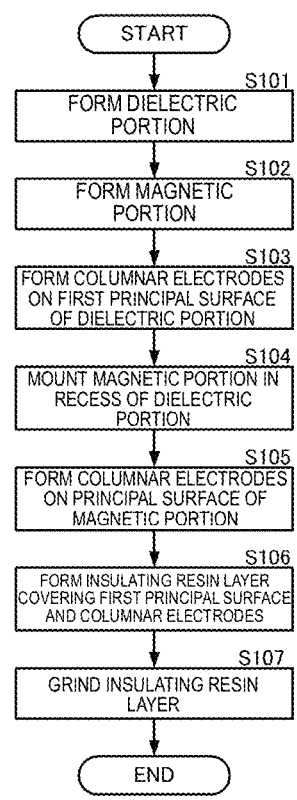
FIG. 4 is a flowchart illustrating a main process of manufacturing the interposer substrate according to the first preferred embodiment of the present invention.
Figure 5A:
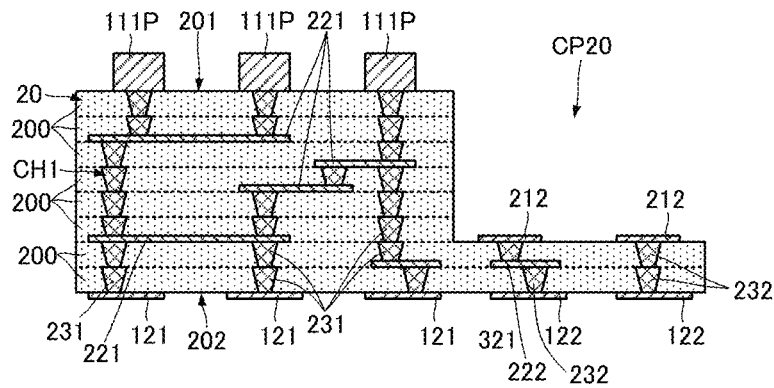
FIGS. 5A to 5C are lateral cross-sectional views each illustrating a configuration in a step of the flowchart illustrated in FIG. 4.
Figure 5B:
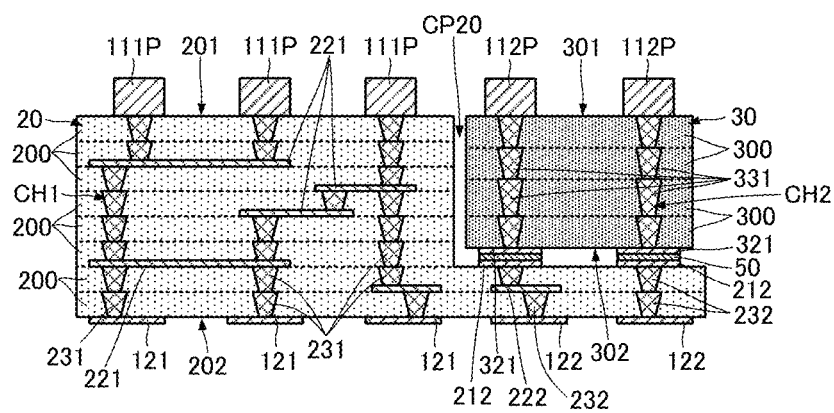
Figure 5C:
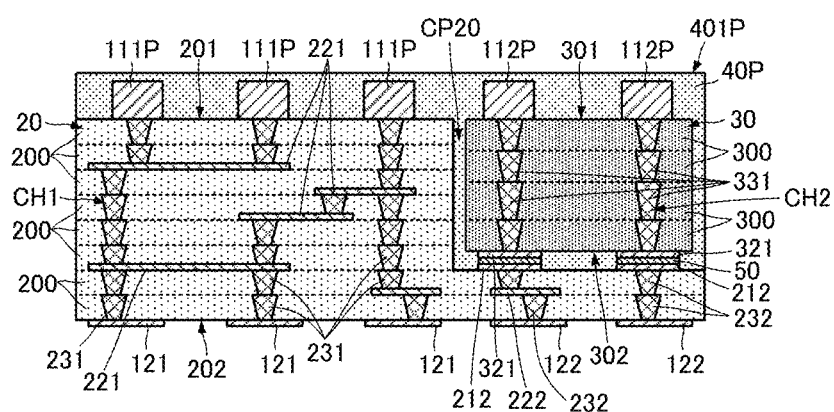

The interposer substrate 10 configured as described above may be manufactured by a non-limiting example of a manufacturing method as illustrated in FIG. 4 and FIGS. 5A to 5C. FIG. 4 is a flowchart illustrating a main process of manufacturing the interposer substrate according to the first preferred embodiment of the present invention. FIG. 5A to FIG. 5C are lateral cross-sectional views each illustrating a configuration in a step of the flow illustrated in FIG. 4.

First, the dielectric portion 20 is formed (S101). The dielectric portion 20 may preferably be formed, for example, using a known method for manufacturing low-temperature sintered ceramic multilayer substrates (or LTCC substrates). The magnetic portion 30 is also formed (S102). The magnetic portion 30 may preferably be formed, for example, using a manufacturing method which involves stacking and sintering ceramic green sheets containing magnetic powder. Although the dielectric portion 20 and the magnetic portion 30 are formed in this order in FIG. 4, they do not necessarily need to be formed in this order, and may be simultaneously and individually formed. The dielectric portion 20 and the magnetic portion 30 are each formed as a multilayer body. This facilitates manufacture of the interposer substrate 10 having the configuration described above.

Next, as illustrated in FIG. 5A, a plurality of columnar electrodes 111P are formed on the first principal surface 201 of the dielectric portion 20 (S103). The columnar electrodes 111P correspond to "first columnar electrodes". The plurality of columnar electrodes 111P are formed to have a greater height than the connection terminal electrodes 111 described above. The plurality of columnar electrodes 111P may preferably be made, for example, by forming copper posts, building up solder, or stacking copper or silver layers.

Next, the magnetic portion 30 is mounted in the recess CP20 of the dielectric portion 20 (S104). Then, as illustrated in FIG. 5B, a plurality of columnar electrodes 112P are formed on the principal surface 301 of the magnetic portion 30 (S105). The columnar electrodes 112P correspond to "second columnar electrodes". The plurality of columnar electrodes 112P are formed to have a greater height than the connection terminal electrodes 112 described above. Similar to the plurality of columnar electrodes 111P described above, the plurality of columnar electrodes 112P may preferably be made, for example, by forming copper posts, building up solder, or stacking copper or silver layers.

Next, an insulating resin portion 40P is formed as illustrated in FIG. 5C (S106). The insulating resin portion 40P is formed to fill the recess CP20 of the dielectric portion 20 and cover the first principal surface 201 of the dielectric portion 20, the principal surface 301 of the magnetic portion 30, and the plurality of columnar electrodes 111P and 112P.

Next, the surface of the insulating resin portion 40P (i.e., the surface opposite the dielectric portion 20 and the magnetic portion 30) is ground (S107). The grinding is performed such that the plurality of columnar electrodes 111P and 112P are ground and exposed to the outside. The shape illustrated in FIG. 1B is thus produced.

With this manufacturing method, the interposer substrate 10 having the configuration described above is able to be easily manufactured.

Also, the flatness of the interposer substrate 10 is improved on the first principal surface side. This facilitates joining of the flat cable 800 and improves joint reliability between the interposer substrate 10 and the flat cable 800.

Figure 6A:
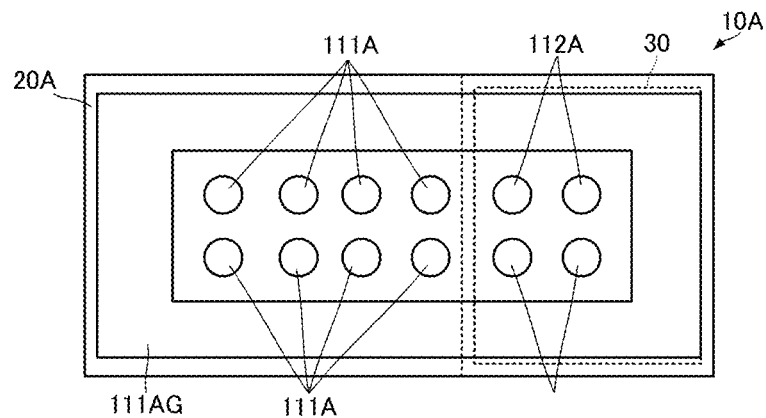
FIG. 6A is a plan view of an interposer substrate according to a second preferred embodiment of the present invention, as viewed from a first principal surface.
Figure 6B:
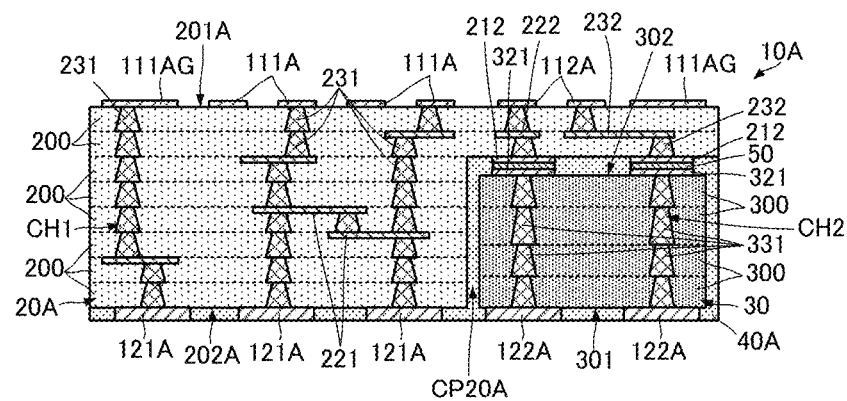
FIG. 6B is a lateral cross-sectional view illustrating a configuration of the interposer substrate.
Figure 6C:
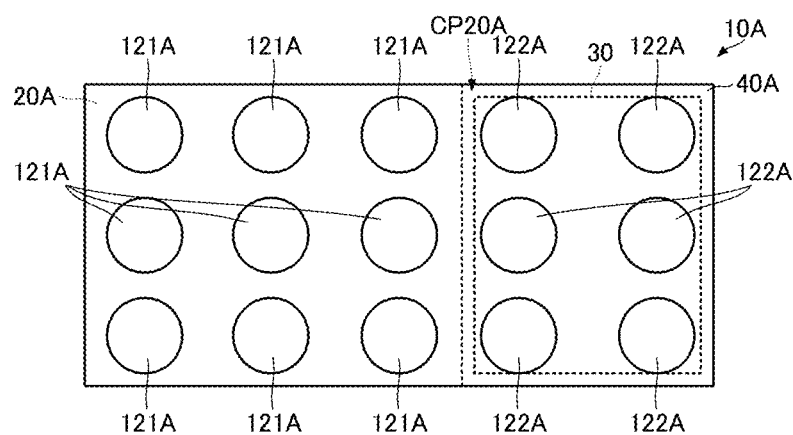
FIG. 6C is a plan view of the interposer substrate, as viewed from a second principal surface.

An interposer substrate according to a second preferred embodiment of the present invention will now be described with reference to the drawings. FIG. 6A is a plan view of an interposer substrate according to the second preferred embodiment of the present invention, as viewed from a first principal surface, FIG. 6B is a lateral cross-sectional view illustrating a configuration of the interposer substrate, and FIG. 6C is a plan view of the interposer substrate, as viewed from a second principal surface. For ease of viewing, some easily identifiable portions are not denoted in FIG. 6B.

As illustrated in FIGS. 6A to 6C, an interposer substrate 10A according to the second preferred embodiment mainly differs from the interposer substrate 10 according to the first preferred embodiment in that a recess CP20A of a dielectric portion 20A is on the side of a second principal surface 202A, and also differs in the configuration of terminal electrodes on the first and second principal surfaces of the base body. The remaining configurations of the interposer substrate 10A are the same or substantially the same as those of the interposer substrate 10, and the description of the same or substantially the same portions will be omitted.

As illustrated in FIG. 6B, the dielectric portion 20A includes the recess CP20A recessed from the second principal surface 202A. As illustrated in FIG. 6C, a plurality of circuit-board terminal electrodes 121A are provided in an array on the second principal surface 202A of the dielectric portion 20A.

The magnetic portion 30 is disposed inside the recess CP20A. The principal surface 301 of the magnetic portion 30 is flush with the second principal surface 202A of the dielectric portion 20A. As illustrated in FIG. 6C, a plurality of circuit-board terminal electrodes 122A are provided in an array on the principal surface 301 of the magnetic portion 30.

The plurality of circuit-board terminal electrodes 122A are flush or substantially flush with the plurality of circuit-board terminal electrodes 121A. This means that an outer surface (i.e., surface mounted on the circuit board) adjacent to the second principal surface of the base body is flat or substantially flat.

The recess CP20A of the dielectric portion 20A is filled with an insulating resin portion 40A, which covers the magnetic portion 30. The insulating resin portion 40A covers both of the second principal surface 202A of the dielectric portion 20A and the principal surface 301 of the magnetic portion 30, and enables only end surfaces of the plurality of circuit-board terminal electrodes 121A and 122A to be exposed to the outside.

A plurality of connection terminal electrodes 111A and 112A and an auxiliary terminal electrode 111AG are provided in a predetermined array pattern on the first principal surface 201A of the dielectric portion 20A. Specifically, the plurality of connection terminal electrodes 111A are provided in a region not overlapping the recess CP20A of the dielectric portion 20A in plan view of the interposer substrate 10A. The plurality of connection terminal electrodes 112A are provided in a region overlapping the recess CP20A of the dielectric portion 20A in plan view of the interposer substrate 10A.

The auxiliary terminal electrode 111AG is disposed closer to the edge of the first principal surface 201A than the region where the plurality of connection terminal electrodes 111A and 112A are provided is. The auxiliary terminal electrode 111AG preferably has, for example, an annular or substantially annular shape and surrounds, in plan view of the interposer substrate 10A, the region where the plurality of connection terminal electrodes 111A and 112A are provided. That is, the auxiliary terminal electrode 111AG is disposed over both the region not overlapping the recess CP20A of the dielectric portion 20A and the region overlapping the recess CP20A, in plan view of the interposer substrate 10A.

The auxiliary terminal electrode 111AG preferably electrically functions, for example, as a ground electrode. The auxiliary terminal electrode 111AG is for low frequencies and may be treated similarly to the connection terminal electrodes 111A. That is, the auxiliary terminal electrode 111AG is connected to the first wiring electrodes CH1.

The width of the auxiliary terminal electrode 111AG (i.e., the length in a direction orthogonal or substantially orthogonal to the direction of annular extension) is preferably as large as possible. For example, the width of the auxiliary terminal electrode 111AG is preferably longer than the diameter or side length of the plurality of connection terminal electrodes 111A and 112A. Thus, with the auxiliary terminal electrode 111AG, the area to be joined to the external terminal electrodes (not shown) on the flat cable is increased. This improves the joint strength and joint reliability between the interposer substrate 10A and the flat cable.

In the configuration of the interposer substrate 10A, the entire or substantially the entire surface of the interposer substrate 10A connected to the flat cable is the first principal surface 201A of the dielectric portion 20A. This facilitates formation of the auxiliary terminal electrode 111AG shaped to extend over both of the region not overlapping the recess CP20A of the dielectric portion 20A and the region overlapping the recess CP20A. Additionally, this configuration improves flatness of the entire or substantially the entire surface of the interposer substrate 10A connected to the flat cable, and further improves joint reliability between the interposer substrate 10A and the flat cable.

Figure 7:
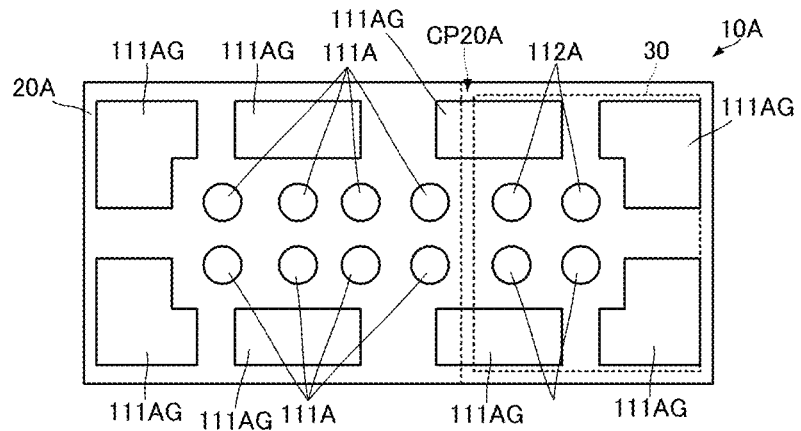
FIG. 7 is a plan view of another example of the interposer substrate according to the second preferred embodiment of the present invention, as viewed from the first principal surface.

The auxiliary terminal electrode 111AG is preferably, for example, an annular electrode that extends continuously along the entire or substantially the entire perimeter, but the shape is not limited to this. FIG. 7 is a plan view of another example of the interposer substrate according to the second preferred embodiment of the present invention, as viewed from the first principal surface.

As illustrated in FIG. 7, the auxiliary terminal electrode 111AG includes gaps where no electrode is provided, along the direction of annular extension. The auxiliary terminal electrode 111AG may include either one or a plurality of gaps.

With this configuration, it is still possible to improve joint reliability between the interposer substrate 10A and the flat cable.

In the preferred embodiments described above, the recess is preferably open on three sides of the dielectric portion. However, the recess may be open on two sides or one side, or may be open only on one principal surface of the dielectric portion.

An interposer substrate according to a third preferred embodiment will now be described with reference to the drawings. The interposer substrate according to the present preferred embodiment differs from the interposer substrates according to the first and second preferred embodiments in the configuration of a magnetic portion 30A.

Figure 8:
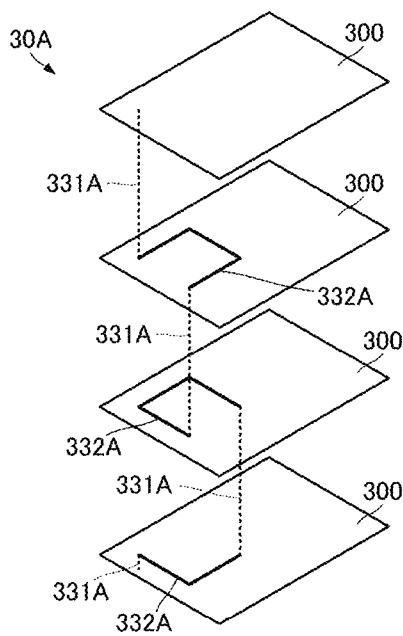
FIG. 8 is an exploded perspective view schematically illustrating a configuration of a magnetic portion according to a third preferred embodiment of the present invention.

FIG. 8 is an exploded perspective view schematically illustrating a configuration of a magnetic portion according to the third preferred embodiment of the present invention. Note that FIG. 8 illustrates characteristic portions of the magnetic portion according to the third preferred embodiment, and the illustration of other portions is omitted.

The magnetic portion 30A includes a plurality of magnetic ceramic layers 300 that are stacked along the thickness direction. The plurality of magnetic ceramic layers 300 each include a linear electrode 332A provided on a principal surface thereof. The plurality of linear electrodes 332A are connected by connecting electrodes 331A passing through the plurality of magnetic ceramic layers 300 in the thickness direction. The plurality of linear electrodes 332A and the plurality of connecting electrodes 331A preferably define a spiral electrode having an axis in the thickness direction of the magnetic portion 30A. A coil pattern defined by the spiral electrode is used in the second wiring electrodes CH2. This increases the inductance of the second wiring electrodes CH2 and enables, for example, the magnetic portion 30A to achieve a high ferrite bead effect.

Although a spiral electrode pattern is provided in the present preferred embodiment, another coil electrode pattern, such as a meandering electrode pattern or a simple linear electrode pattern, may be used.

Figure 9:
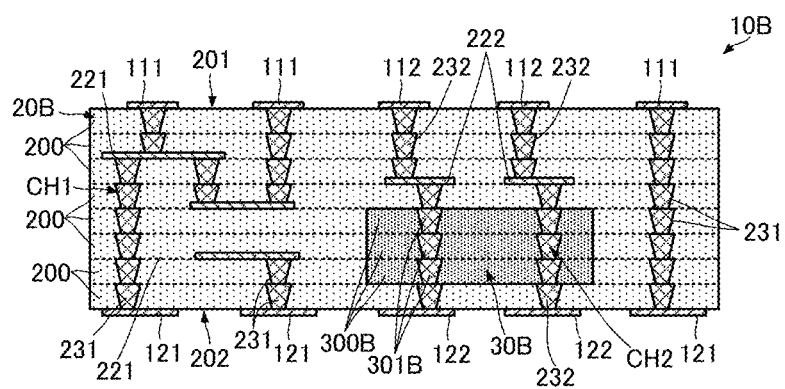
FIG. 9 is a lateral cross-sectional view illustrating a configuration of an interposer substrate according to a fourth preferred embodiment of the present invention.

An interposer substrate according to a fourth preferred embodiment of the present invention will now be described with reference to the drawings. FIG. 9 is a lateral cross-sectional view illustrating a configuration of an interposer substrate according to the fourth preferred embodiment of the present invention.

As illustrated in FIG. 9, an interposer substrate 10B according to the fourth preferred embodiment differs from the interposer substrate 10 according to the first preferred embodiment in that a magnetic portion 30B is embedded in a dielectric portion 20B. The remaining configurations of the interposer substrate 10B are the same or substantially the same as those of the interposer substrate 10, and the description of the same or substantially the same portions will be omitted.

As illustrated in FIG. 9, the magnetic portion 30B includes a plurality of magnetic ceramic layers 300B that are stacked. The dielectric portion 20B includes a plurality of dielectric ceramic layers 200. The magnetic portion 30B is embedded in the dielectric portion 20B.

The first wiring electrodes CH1 pass through the dielectric portion 20B, and do not pass through the magnetic portion 30B. The second wiring electrodes CH2 pass through the magnetic portion 30B. Thus, the same operational advantages as those of the interposer substrates according to the above-described preferred embodiments are achieved.

Figure 10:
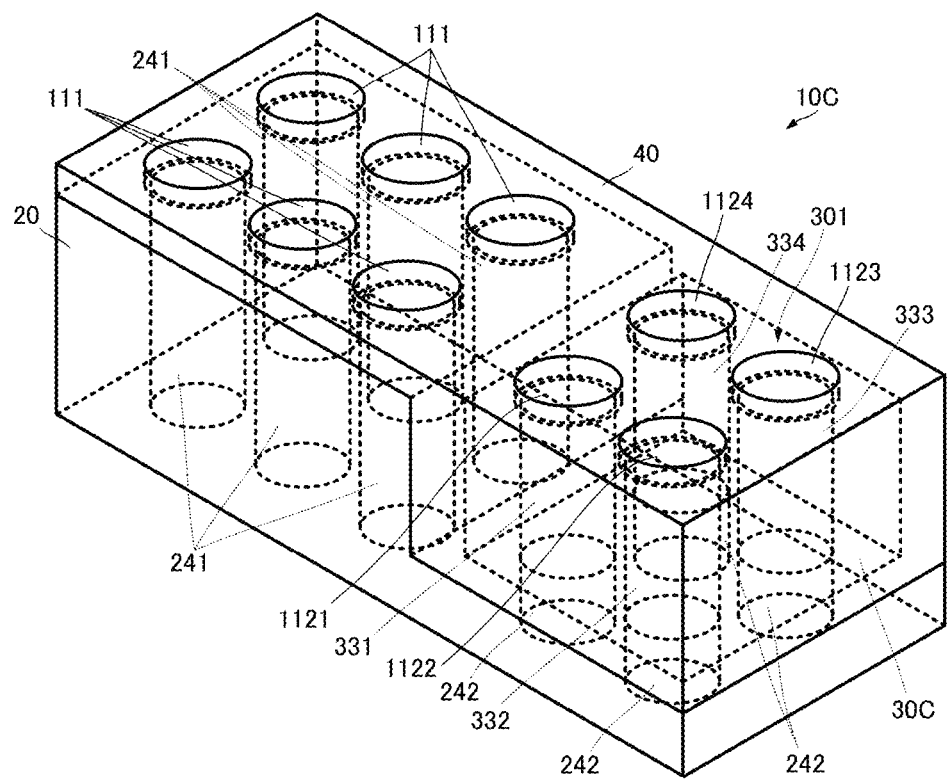
FIG. 10 is an external perspective view illustrating a configuration of an interposer substrate according to a fifth preferred embodiment of the present invention.
Figure 11:
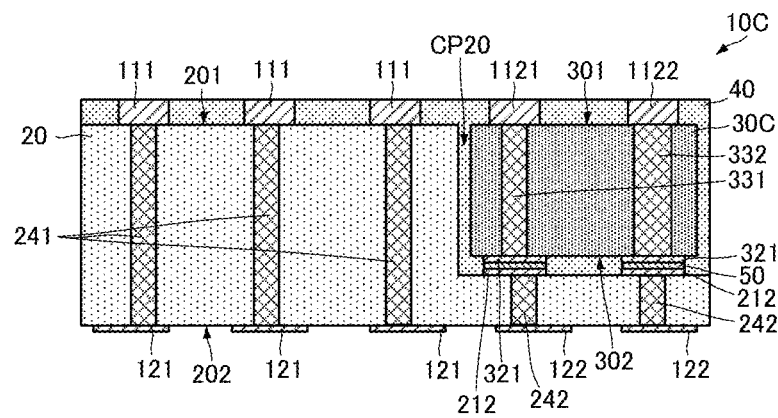
FIG. 11 is a lateral cross-sectional view illustrating the configuration of the interposer substrate according to the fifth preferred embodiment of the present invention.
Figure 12A:
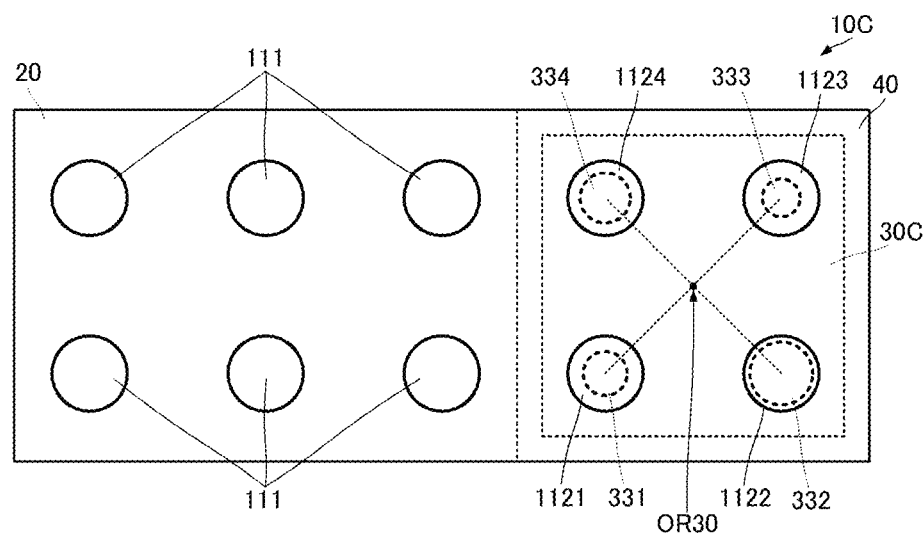
FIG. 12A is a plan view of a first example of an arrangement of a magnetic portion according to the fifth preferred embodiment.
Figure 12B:
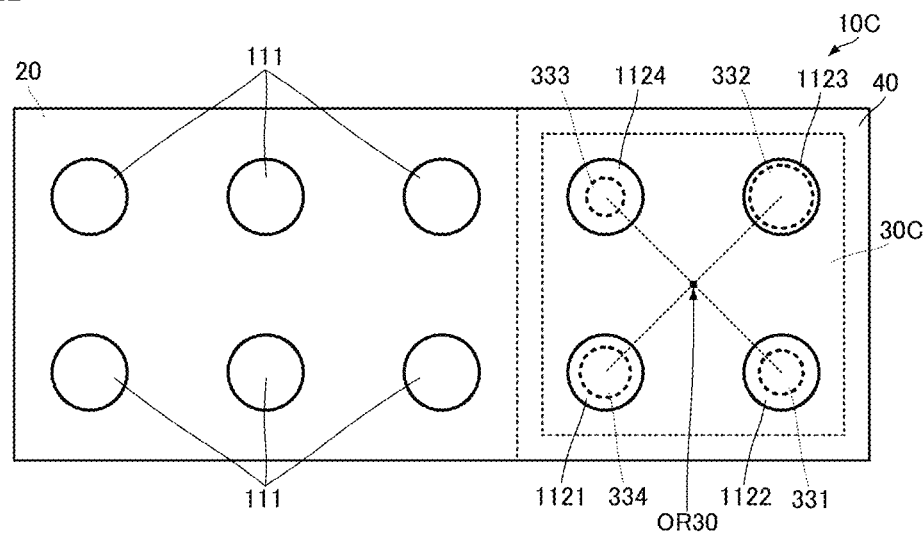
FIG. 12B is a plan view of a second example of an arrangement of the magnetic portion according to the fifth preferred embodiment of the present invention.

An interposer substrate according to a fifth preferred embodiment of the present invention will now be described with reference to the drawings. FIG. 10 is an external perspective view illustrating a configuration of an interposer substrate according to the fifth preferred embodiment of the present invention. FIG. 11 is a lateral cross-sectional view illustrating the configuration of the interposer substrate according to the fifth preferred embodiment of the present invention. FIG. 12A is a plan view of a first form of arrangement of a magnetic portion according to the fifth preferred embodiment, and FIG. 12B is a plan view of a second form of arrangement of the magnetic portion according to the fifth preferred embodiment.

Note that FIG. 10 does not show the electrodes on the second principal surface of the dielectric portion. FIG. 10 and FIG. 11 schematically illustrate the structure of the dielectric portion 20 and a magnetic portion 30C. Similar to the magnetic portion 30, the magnetic portion 30C is defined by a multilayer body.

As illustrated in FIG. 10 and FIG. 11, an interposer substrate 10C according to the fifth preferred embodiment differs from the interposer substrate 10 according to the first preferred embodiment in that the arrangement of the magnetic portion 30C may have multiple configurations. The remaining configurations of the interposer substrate 10C are the same or substantially the same as those of the interposer substrate 10, and the description of the same or substantially the same portions will be omitted.

The magnetic portion 30C includes a plurality of connecting electrodes 331, 332, 333, and 334 provided therein. The plurality of connecting electrodes 331, 332, 333, and 334 mainly extend in a direction parallel or substantially parallel to the thickness direction of the magnetic portion 30C.

The plurality of connecting electrodes 331, 332, 333, and 334 are structured and configured to have different impedances. For example, in the configuration illustrated in FIG. 10, FIG. 11, and FIGS. 12A and 12B, the plurality of connecting electrodes 331, 332, 333, and 334 are preferably linear electrodes extending along the thickness direction of the magnetic portion 30C (i.e., in the direction orthogonal or substantially orthogonal to the first principal surface 301 and the second principal surface 302), made of the same material, and having different thicknesses. The connecting electrodes 331, 332, 333, and 334 thus have different impedances.

As illustrated in FIGS. 12A and 12B, end portions of the plurality of connecting electrodes 331, 332, 333, and 334, in the first principal surface 301 and the second principal surface 302, are rotationally symmetrically arranged with respect to a rotation center OR30 in plan view (i.e., as viewed in the direction orthogonal to the first principal surface 301).

The principal surface 301 of the magnetic portion 30C includes a plurality of connection terminal electrodes 1121, 1122, 1123, and 1124 provided thereon. As illustrated in FIGS. 12A and 12B, the plurality of connection terminal electrodes 1121, 1122, 1123, and 1124 are also rotationally symmetrically arranged with respect to the rotation center OR30 in plan view (i.e., as viewed in the direction orthogonal or substantially orthogonal to the first principal surface 301).

In the first configuration illustrated in FIG. 12A, the connection terminal electrode 1121 overlaps the connecting electrode 331 in plan view and is connected to the connecting electrode 331. The connection terminal electrode 1122 overlaps the connecting electrode 332 in plan view and is connected to the connecting electrode 332. The connection terminal electrode 1123 overlaps the connecting electrode 333 in plan view and is connected to the connecting electrode 333. The connection terminal electrode 1124 overlaps the connecting electrode 334 in plan view and is connected to the connecting electrode 334.

In the second configuration illustrated in FIG. 12B, the connection terminal electrode 1121 overlaps the connecting electrode 334 in plan view and is connected to the connecting electrode 334. The connection terminal electrode 1122 overlaps the connecting electrode 331 in plan view and is connected to the connecting electrode 331. The connection terminal electrode 1123 overlaps the connecting electrode 332 in plan view and is connected to the connecting electrode 332. The connection terminal electrode 1124 overlaps the connecting electrode 333 in plan view and is connected to the connecting electrode 333.

That is, as illustrated in FIGS. 12A and 12B, from the first configuration to the second configuration, the magnetic portion 30C rotates about 90° about the rotation center OR30 in plan view. Although FIGS. 12A and 12B only illustrate two configurations with approximately a 90° difference in angle, another configuration with approximately a 180° or a 270° difference is also possible.

With this configuration, even when the configuration of the magnetic portion 30C with respect to the dielectric portion 20 is changed, the physical connection to an external unit does not change. On the other hand, by varying the configuration of the magnetic portion 30C with respect to the dielectric portion 20, the arrangement pattern of wiring electrodes with different impedances, that is, the electrical connection to the external unit, may be changed.

Thus, without changing the configuration of physical connection to the external unit, the interposer substrate 100 is able to change the configuration of electrical connection to the external unit.

Figure 13:
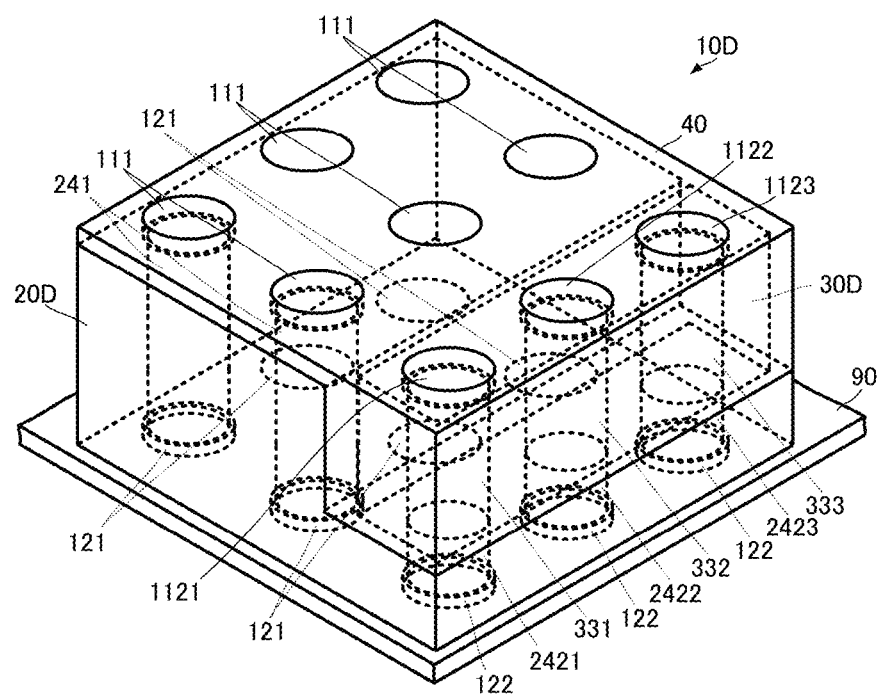
FIG. 13 is an external perspective view illustrating a configuration of an interposer substrate according to a sixth preferred embodiment of the present invention.
Figure 14A:
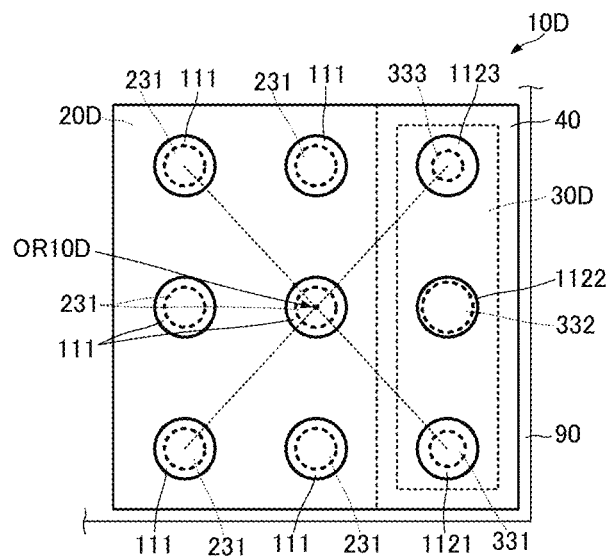
FIG. 14A is a plan view of a first example of an arrangement of the interposer substrate according to the sixth preferred embodiment.
Figure 14B:
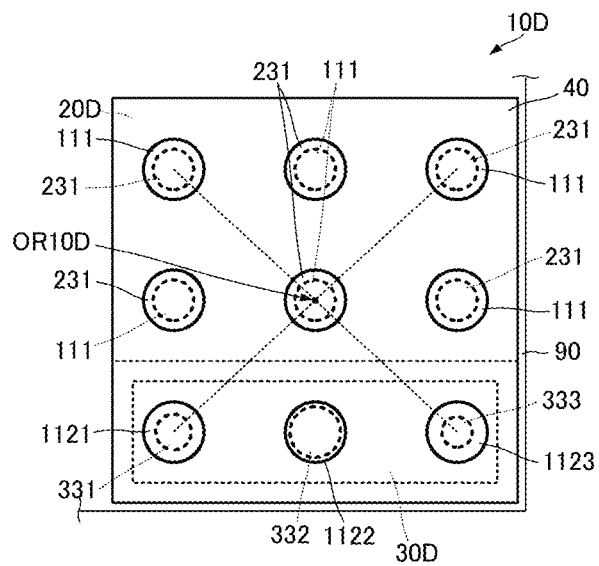
FIG. 14B is a plan view of a second example of an arrangement of the interposer substrate according to the sixth preferred embodiment of the present invention.

An interposer substrate according to a sixth preferred embodiment of the present invention will now be described with reference to the drawings. FIG. 13 is an external perspective view illustrating a configuration of an interposer substrate according to the sixth preferred embodiment of the present invention. FIG. 14A is a plan view of a first configuration of the interposer substrate according to the sixth preferred embodiment, and FIG. 14B is a plan view of a second configuration of the interposer substrate according to the sixth preferred embodiment. For ease of viewing, the illustration of some components of a dielectric portion is omitted in FIG. 13.

An interposer substrate 10D according to the sixth preferred embodiment differs from the interposer substrate 10C according to the fifth preferred embodiment in the shape of a dielectric portion 20D and the shape of a magnetic portion 30D. A basic configuration of the interposer substrate 10D is the same or substantially the same as that of the interposer substrate 10C, and the description of the same portions will be omitted.

The interposer substrate 10D includes the dielectric portion 20D and the magnetic portion 30D. A plurality of connection terminal electrodes 111, 1121, 1122, and 1123 are provided on the first principal surface side of the interposer substrate 10D.

As illustrated in FIGS. 14A and 14B, the plurality of connection terminal electrodes 111, 1121, 1122, and 1123 are rotationally symmetrically arranged with respect to a rotation center OR10D in plan view (i.e., as viewed in the direction orthogonal to the first principal surface).

Also as illustrated in FIGS. 14A and 14B, a plurality of connecting electrodes 231, 331, 332, and 333 are rotationally symmetrically arranged with respect to the rotation center OR10D in plan view (i.e., as viewed in the direction orthogonal to the first principal surface).

With this configuration, by changing the arrangement angle as illustrated in FIGS. 14A and 14B, the electrical connection to the circuit board 90 may be changed without changing the configuration of physical connection thereto.

In the interposer substrate 10D, the arrangement of the magnetic portion 30D may be changed. Thus, in a single type of physical connection, the electrical connection is able to be variously changed.

Figure 15A:
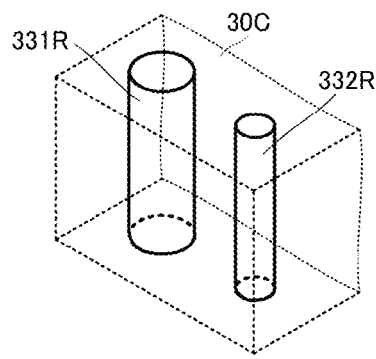
FIG. 15A illustrates a configuration of resistance elements.

In the interposer substrate 10C according to the fifth preferred embodiment and the interposer substrate 10D according to the sixth preferred embodiment, the connecting electrodes provided in the dielectric portion or magnetic portion may be provided in various configurations as described below. FIG. 15A illustrates a configuration of resistance elements, FIG. 15B illustrates a configuration of inductor elements, and FIGS. 15C and 15D each illustrate a configuration of capacitor elements.

In FIG. 15A, connecting electrodes 331R and 332R are structured to linearly extend along the thickness direction of the magnetic portion 30C. The connecting electrodes 331R and 332R are preferably made of the same material and differ in thickness. Resistance elements with different resistance values are thus produced.

The connecting electrodes 331R and 332R may preferably define and function as inductor elements by being provided in the magnetic portion 30C. The connecting electrodes 331R and 332R may be provided in the dielectric portion 20D to defined and function as resistance elements. The connecting electrodes 331R and 332R may be made of different materials to make their resistance values different.

Figure 15B:
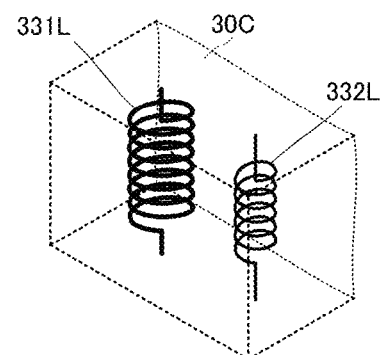
FIG. 15B illustrates a configuration of inductor elements, and FIGS. 15C and 15D each illustrate a configuration of capacitor elements.

In FIG. 15B, connecting electrodes 331L and 332L are spiral electrodes each having a winding axis along the thickness direction of the magnetic portion 30C. The connecting electrodes 331L and 332L are preferably made of the same material, and differ in at least the winding diameter or the number of turns, for example. Inductor elements with different inductances are thus produced.

The connecting electrodes 331L and 332L may be provided in the dielectric portion 20D to define and function as inductor elements. However, providing the connecting electrodes 331L and 332L in the magnetic portion 30D provide additional inductance, and facilitates size reduction and improvement of inductor characteristics. The connecting electrodes 331L and 332L may be made of different materials to make their inductances different.

Figure 15C:
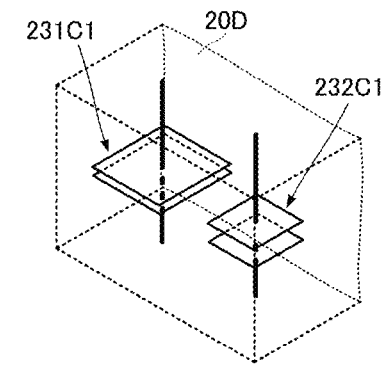

In FIG. 15C, connecting electrodes 231C1 and 232C1 are each defined by a pair of counter electrodes including surfaces orthogonal or substantially orthogonal to the thickness direction of the dielectric portion 20D and a linear electrode connecting the counter electrodes. The connecting electrodes 231C1 and 232C1 are preferably, for example, made of the same material, and differ in the area where the counter electrodes face each other and the distance between the counter electrodes. Capacitor elements with different capacitances are thus produced. These capacitor elements are connected in series to the connecting electrodes. The different capacitances may be achieved by varying the relative dielectric constant of the dielectric between the counter electrodes.

Figure 15D:
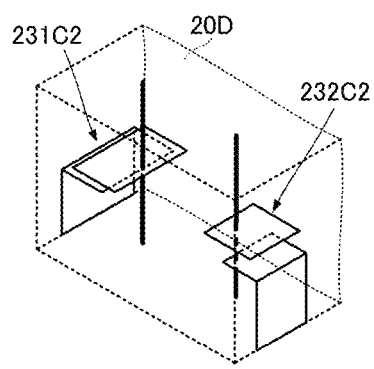

In FIG. 15D, connecting electrodes 231C2 and 232C2 are each defined by a pair of counter electrodes including surfaces orthogonal or substantially orthogonal to the thickness direction of the dielectric portion 20D and a linear electrode connected to one of the counter electrodes. One of the counter electrodes extends from inside to the periphery of the dielectric portion 20D and further extends along the periphery. The connecting electrodes 231C2 and 232C2 are preferably, for example, made of the same material, and differ in the area where the counter electrodes face each other and the distance between the counter electrodes. Capacitor elements with different capacitances are thus produced. These capacitor elements are connected in parallel to the connecting electrodes. For example, when the one of the counter electrodes is grounded, the resulting capacitor element is connected between the linear connecting electrode and the ground potential. The different capacitances may be achieved by varying the relative dielectric constant of the dielectric between the counter electrodes.

FIGS. 15A to 15C, and 15D each illustrate a configuration of the same type of circuit elements. However, different types of circuit elements may be provided in the dielectric portion or the magnetic portion. For example, the configuration of FIG. 15A and the configuration of FIG. 15C may be combined to define a resistance element and a capacitor element in the dielectric portion.

In the interposer substrate 10C according to the fifth preferred embodiment and the interposer substrate 10D according to the sixth preferred embodiment, it is not necessary that all of the connecting electrodes are different, and it is only necessary that at least one connecting electrode is different from the other connecting electrodes.

Figure 16:
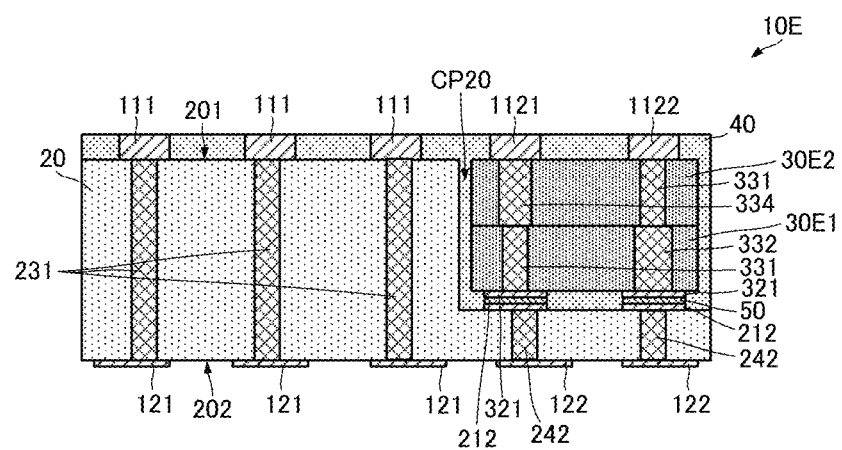
FIG. 16 is a lateral cross-sectional view illustrating a configuration of an interposer substrate according to a seventh preferred embodiment of the present invention.
Figure 17A:
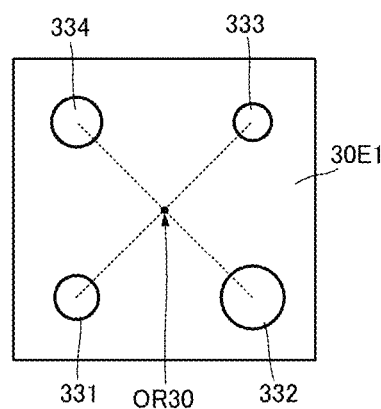
FIG. 17A illustrates a first example of an arrangement of a magnetic portion.
Figure 17B:
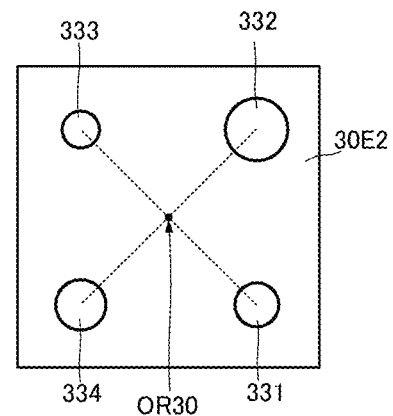
FIG. 17B illustrates a second example of an arrangement of a magnetic portion.

An interposer substrate according to a seventh preferred embodiment of the present invention will now be described with reference to the drawings. FIG. 16 is a lateral cross-sectional view illustrating a configuration of an interposer substrate according to the seventh preferred embodiment of the present invention. FIG. 17A illustrates a first configuration of a magnetic portion, and FIG. 17B illustrates a second configuration of a magnetic portion.

An interposer substrate 10E according to the seventh preferred embodiment differs from the interposer substrate 10C according to the fifth preferred embodiment in that it includes magnetic portions 30E1 and 30E2. The remaining configurations of the interposer substrate 10E are the same or substantially the same as those of the interposer substrate 10C, and the description of the same or substantially the same portions will be omitted.

As illustrated in FIG. 16, the interposer substrate 10E includes the magnetic portions 30E1 and 30E2. The magnetic portions 30E1 and 30E2 are thinner in thickness than the magnetic portion 30C according to the fifth preferred embodiment, and the remaining configurations are the same or substantially the same.

The magnetic portions 30E1 and 30E2 are stacked such that their principal surfaces are parallel or substantially parallel to each other. For example, the magnetic portion 30E1 is positioned in a first configuration illustrated in FIG. 17A, and the magnetic portion 30E2 is positioned in a second configuration illustrated in FIG. 17B. The rotation centers OR30 of the magnetic portions 30E1 and 30E2 coincide in plan view. With this configuration, a circuit configuration is able to be provided in which circuit elements provided in the magnetic portion 30E1 are connected in series to respective circuit elements provided in the magnetic portion 30E2.

Thus, without changing the physical connection to an external unit, the electrical connection thereto is able to be variously changed.

Figure 18:
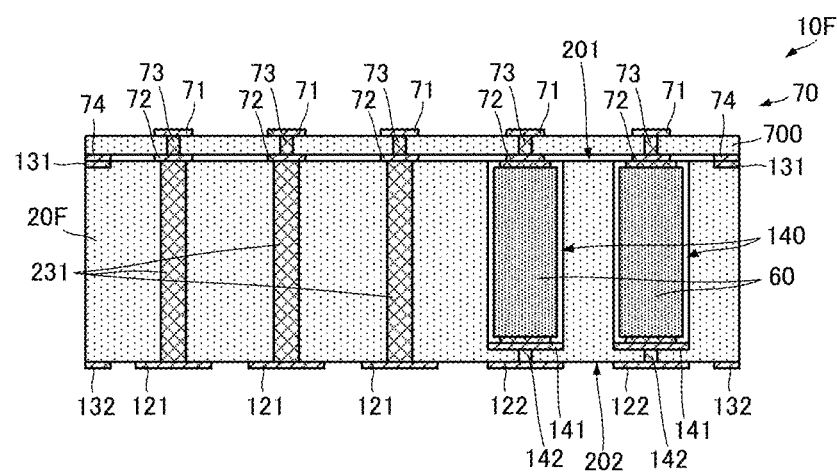
FIG. 18 is a lateral cross-sectional view illustrating a configuration of an interposer substrate according to an eighth preferred embodiment of the present invention.

An interposer substrate according to an eighth preferred embodiment of the present invention will now be described with reference to the drawings. FIG. 18 is a lateral cross-sectional view illustrating a configuration of an interposer substrate according to the eighth preferred embodiment of the present invention.

An interposer substrate 10F according to the eighth preferred embodiment differs from the interposer substrate 10 according to the first preferred embodiment in the shape of recesses 140 provided in a dielectric portion 20F, and in that columnar elements 60 are disposed in the respective recesses 140. The interposer substrate 10F also differs in that it includes a cover 70, instead of the insulating resin portion 40. The remaining configurations of the interposer substrate 10F are the same or substantially the same as those of the interposer substrate 10, and the description of the same or substantially the same portions will be omitted.

As illustrated in FIG. 18, the interposer substrate 10F includes the dielectric portion 20F, the plurality of columnar elements 60, and the cover 70.

Figure 19A:
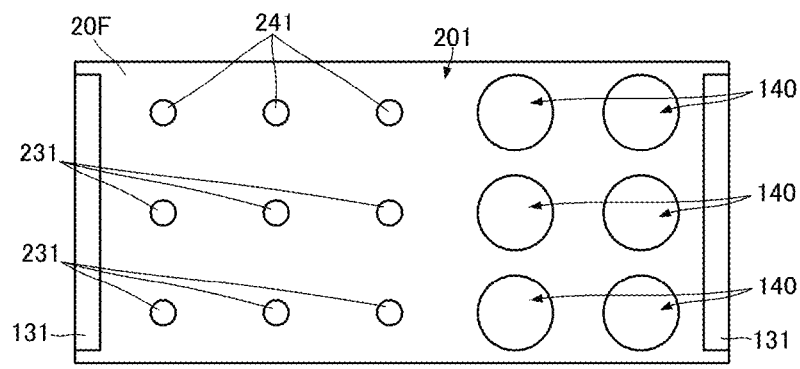
FIG. 19A is a plan view of a dielectric portion according to a preferred embodiment of the present invention, as viewed from a first principal surface.
Figure 19B:
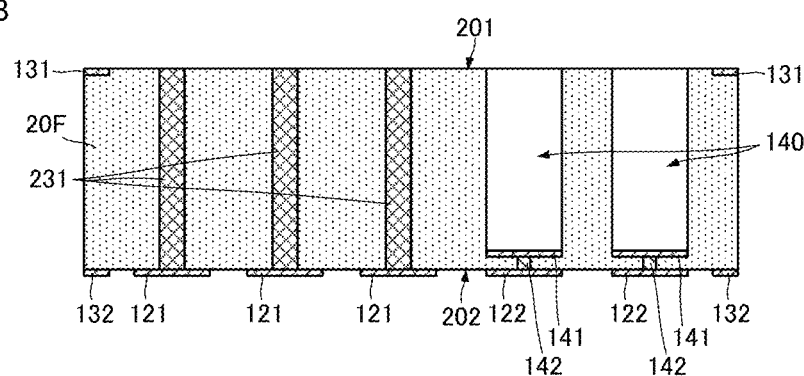
FIG. 19B is a lateral cross-sectional view of the dielectric portion.
Figure 19C:
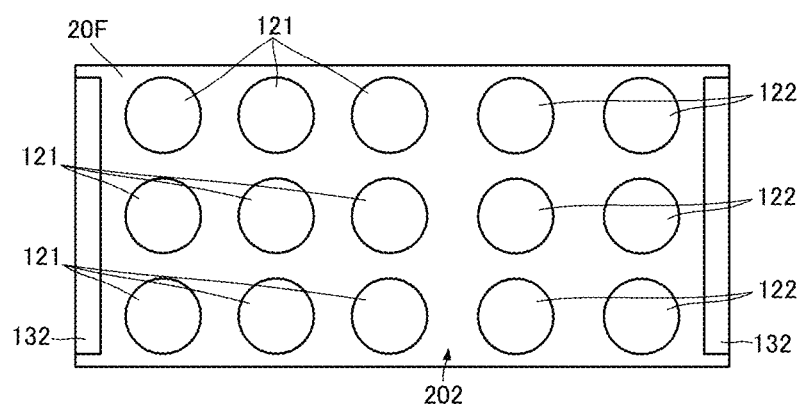
FIG. 19C is a plan view of the dielectric portion, as viewed from a second principal surface.

FIG. 19A is a plan view of the dielectric portion, as viewed from the first principal surface, FIG. 19B is a lateral cross-sectional view of the dielectric portion, and FIG. 19C is a plan view of the dielectric portion, as viewed from the second principal surface.

The dielectric portion 20F includes the plurality of recesses 140 provided therein. The plurality of recesses 140 are recessed from the first principal surface 201 of the dielectric portion 20F toward the second principal surface 202 of the dielectric portion 20F. The plurality of recesses 140 are cylindrical or substantially cylindrical. In plan view of the dielectric portion 20F, the plurality of recesses 140 overlap the respective circuit-board terminal electrodes 122 on the second principal surface 202. The plurality of recesses 140 accommodate the columnar elements 60 (described below). Specifically, the diameter of the plurality of recesses 140 is preferably the same or substantially the same as the diameter of the columnar elements 60 and large.

The plurality of recesses 140 include terminal electrodes 141 provided at respective bottom portions thereof. The plurality of terminal electrodes 141 are connected to the respective overlapping circuit-board terminal electrodes 121, with interlayer connecting electrodes 142 interposed therebetween.

Figure 20A:
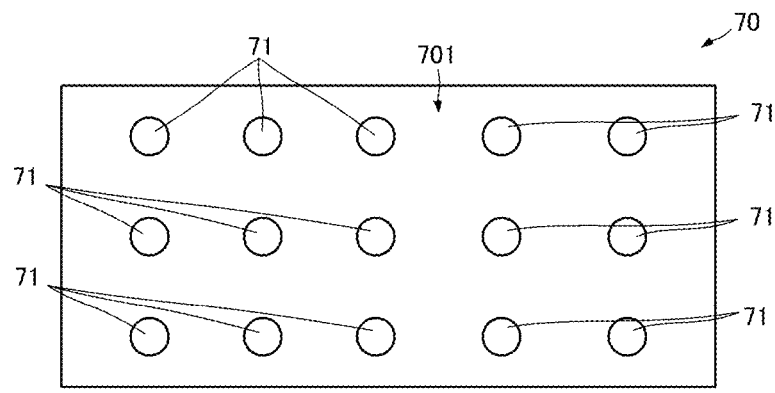
FIG. 20A is a plan view of a cover according to a preferred embodiment of the present invention, as viewed from a first principal surface.
Figure 20B:
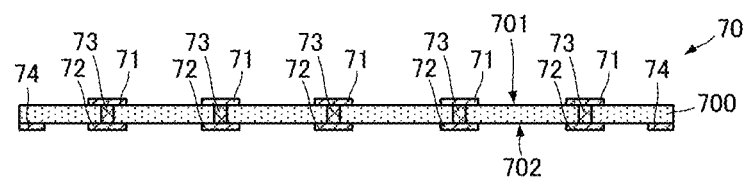
FIG. 20B is a lateral cross-sectional view of the cover.
Figure 20C:
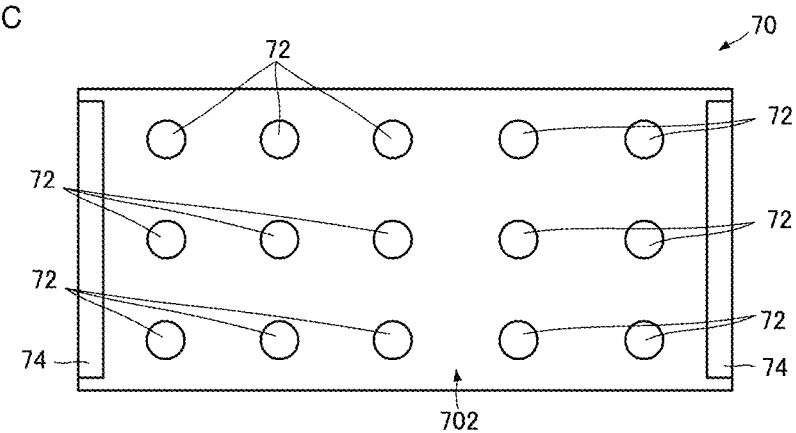
FIG. 20C is a plan view of the cover, as viewed from a second principal surface.

FIG. 20A is a plan view of a cover, as viewed from a first principal surface, FIG. 20B is a lateral cross-sectional view of the cover, and FIG. 20C is a plan view of the cover, as viewed from a second principal surface.

The cover 70 preferably includes a flat plate-shaped main body 700. The planar shape and the planar area of the main body 700 are preferably the same or substantially the same as the planar shape and the planar area of the dielectric portion 20F.

A first principal surface 701 of the main body 700 includes a plurality of terminal electrodes 71 provided thereon. A second principal surface 702 of the main body 700 includes a plurality of terminal electrodes 72 provided thereon. The plurality of terminal electrodes 71 and the plurality of terminal electrodes 72 preferably have the same or substantially the same arrangement pattern. In plan view, the plurality of terminal electrodes 71 overlap the respective terminal electrodes 72. The arrangement pattern of the plurality of terminal electrodes 71 and the plurality of terminal electrodes 72 is the same or substantially the same as the arrangement pattern of the set of the plurality of connecting electrodes 231 and the plurality of recesses 140 in the dielectric portion 20F.

The terminal electrodes 71 and the terminal electrodes 72 overlapping each other are connected by interlayer connecting electrodes 73 passing through the main body 700 in the thickness direction.

Figure 21A:
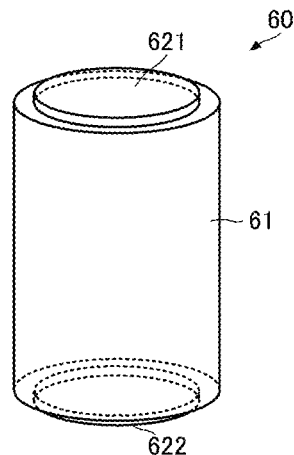
FIG. 21A is an external perspective view of a columnar element according to a preferred embodiment of the present invention.
Figure 21B:
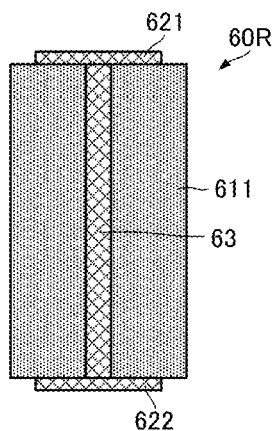
FIG. 21B illustrates a first example of the columnar element.
Figure 21C:
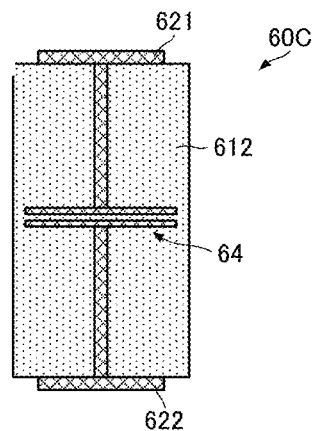
FIG. 21C illustrates a second example of the columnar element.
Figure 21D:
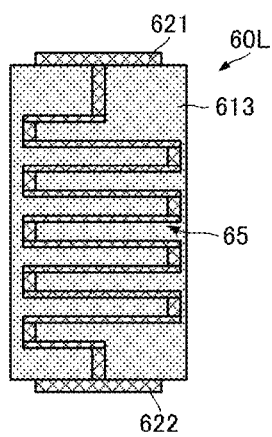
FIG. 21D illustrates a third example of the columnar element.
Figure 21E:
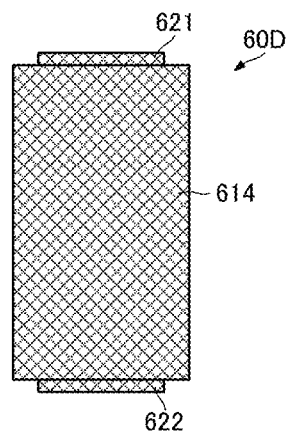
FIG. 21E illustrates a fourth example of the columnar element.

FIG. 21A is an external perspective view of a columnar element, FIG. 21B illustrates a first example of the columnar element, FIG. 21C illustrates a second example of the columnar element, FIG. 21D illustrates a third example of the columnar element, and FIG. 21E illustrates a fourth example of the columnar element.

As illustrated in FIG. 21A, the columnar element 60 includes a main body 61 and terminal electrodes 621 and 622. The main body 61 is preferably a circular or substantially circular columnar body that provides a predetermined circuit element, such as that illustrated in any of FIGS. 21B to 21E. The terminal electrode 621 is provided on one end surface of the main body 61 orthogonal or substantially orthogonal to a side surface (circular periphery) of the main body 61, and the terminal electrode 622 is provided on the other end surface of the main body 61.

In the configuration illustrated in FIG. 21B, the main body 61 is preferably defined by, for example, an insulating body 611 and includes a linear electrode 63 provided therein. The electrode 63 is connected at one end thereof to the terminal electrode 621, and connected at the other end thereof to the terminal electrode 622. This produces a columnar element 60R defined by a resistance element. In the columnar element 60R, the main body 61 may be a dielectric body, for example.

In the configuration illustrated in FIG. 21C, the main body 61 is preferably defined by, for example, a dielectric body 612. The dielectric body 612 includes counter electrodes 64 that are provided therein to face each other in a predetermined area. One of the counter electrodes 64 is connected to the terminal electrode 621, and the other one of the counter electrodes 64 is connected to the terminal electrode 622. This produces a columnar element 60C defined by a capacitor element.

In the configuration illustrated in FIG. 21D, the main body 61 is defined by, for example, a magnetic body 613 and includes a spiral electrode 65 provided therein. The electrode 65 is connected at one end thereof to the terminal electrode 621, and connected at the other end thereof to the terminal electrode 622. This produces a columnar element 60L defined by an inductor element. In the columnar element 60L, the main body 61 may be a dielectric body. However, by being a magnetic body, the main body 61 provides a closed magnetic path and easily produces additional inductance.

In the configuration illustrated in FIG. 21E, the main body 61 is preferably defined by, for example, a conductive body 614. The conductive body 614 is connected at one end thereof to the terminal electrode 621, and connected at the other end thereof to the terminal electrode 622. This produces a columnar element 60D defined by a low-resistance conductor.

As illustrated in FIG. 18, the columnar elements 60 are disposed in the respective recesses 140 of the dielectric portion 20F. The terminal electrodes 622 of the columnar elements 60 are in contact with the respective terminal electrodes 141 in the dielectric portion 20F.

The cover 70 is disposed adjacent to the first principal surface 201 of the dielectric portion 20F. The plurality of terminal electrodes 72 of the cover 70 are in contact with the plurality of connecting electrodes 231 of the dielectric portion 20F or the terminal electrodes 621 of the plurality of columnar elements 60. The cover 70 is secured with a predetermined strength to the dielectric portion 20F by joining securing electrodes 74 on the second principal surface 702 to securing electrodes 131 of the dielectric portion 20F.

With this configuration, by varying the arrangement pattern of the columnar elements 60, the electrical connection to an external unit is able to be variously changed without changing the configuration of physical connection thereto, as in the fifth, sixth, and seventh preferred embodiments described above.

The columnar elements 60 provide a single type of circuit elements in the interposer substrate 10F, but may provide multiple types of circuit elements. Each recess 140 may overlap a plurality of circuit-board terminal electrodes 122, and a plurality of columnar elements 60 may be disposed in the recess 140. The plurality of columnar elements 60 may be combined and disposed as a single unit in the recess 140 overlapping the plurality of plurality of circuit-board terminal electrodes 122.

Figure 22A:
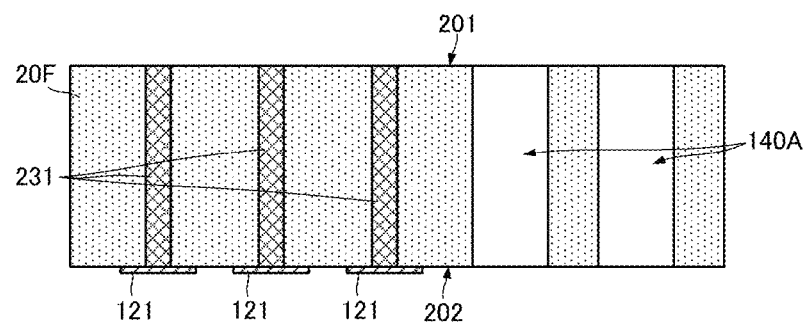
FIG. 22A illustrates a first modified example of recesses provided in the dielectric portion.

The recesses provided in the dielectric portion 20F may be structured as follows. FIG. 22A illustrates a first modified example of the recesses provided in the dielectric portion, and FIG. 22B illustrates a second modified example of the recesses provided in the dielectric portion.

In the example illustrated in FIG. 22A, recesses 140A pass through the dielectric portion 20F in the thickness direction. In this case, the height (length) of the columnar elements 60 is preferably the same or substantially the same as the thickness of the dielectric portion 20F.

Figure 22B:
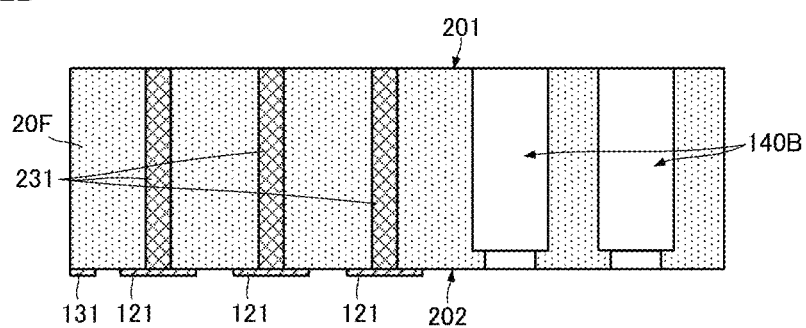
FIG. 22B illustrates a second modified example of recesses provided in the dielectric portion.

In the example illustrated in FIG. 22B, recesses 140B each include an auxiliary through hole extending from the bottom of the recess, which defines and functions as a main portion, to the second principal surface 202 of the dielectric portion 20F. In this case, the columnar elements 60 are configured such that the height of the terminal electrodes 622 is the same or substantially the same as the height of the auxiliary through holes.

Figure 23A:
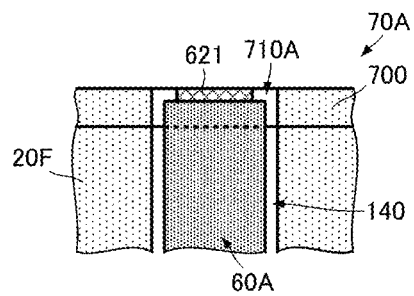
FIG. 23A illustrates a first modified example of installation of the columnar element.

The recesses of the dielectric portion 20F, the cover, and the columnar elements may be structured as follows. FIG. 23A illustrates a first modified example of installation of the columnar element, FIG. 23B illustrates a second modified example of installation of the columnar element, FIG. 23C illustrates a third modified example of installation of the columnar element, FIG. 23D illustrates a fourth modified example of installation of the columnar element, and FIG. 23E illustrates a fifth modified example of installation of the columnar element.

In the example illustrated in FIG. 23A, a cover 70A includes a plurality of through holes 710A provided in the main body 700. The diameter of the through holes 710A is preferably the same or substantially the same as the diameter of the recesses 140 of the dielectric portion 20F. The plurality of through holes 710A overlap the respective recesses 140 of the dielectric portion 20F. Each columnar element 60A extends over both of the recess 140 and the through hole 710A. The terminal electrode 621 of the columnar element 60A is exposed to the outside.

Figure 23B:
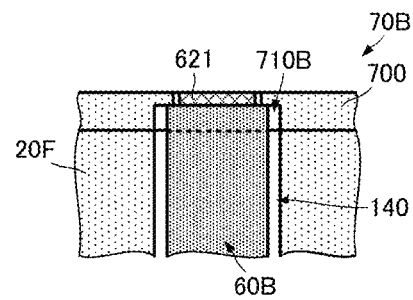
FIG. 23B illustrates a second modified example of installation of the columnar element.
Figure 23C:
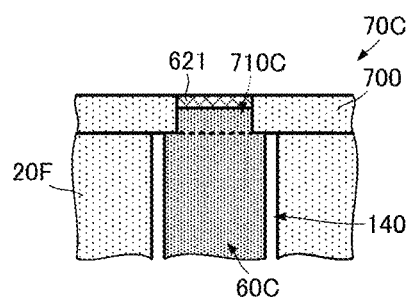
FIG. 23C illustrates a third modified example of installation of the columnar element.
Figure 23D:
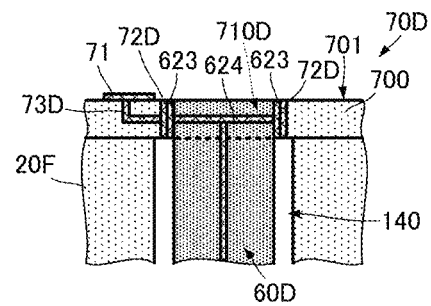
FIG. 23D illustrates a fourth modified example of installation of the columnar element.
Figure 23E:
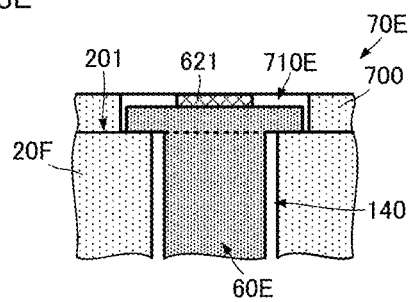
FIG. 23E illustrates a fifth modified example of installation of the columnar element.

In the example illustrated in FIG. 23B, a cover 70B includes a plurality of through holes 710B provided in the main body 700. The plurality of through holes 710B each change in diameter (or area) in the middle of the depth (or height) direction to define a large-diameter portion and a small-diameter portion. The plurality of through holes 710B overlap the respective recesses 140 of the dielectric portion 20F. The cover 70B is disposed such that the large-diameter portions of the through holes 710 are adjacent to the dielectric portion 20F.

Each columnar element 60B extends over both of the recess 140 and the through hole 710A. An end surface of the main body of the columnar element 60B, adjacent to the terminal electrode 621, is in contact with the small-diameter portion, and the terminal electrode 621 passes through the small-diameter portion and is exposed to the outside.

In the example illustrated in FIG. 23C, a cover 70C includes a plurality of through holes 710C provided in the main body 700. The plurality of through holes 710C overlap the respective recesses 140 of the dielectric portion 20F. The diameter of the plurality of through holes 710C is preferably smaller than the diameter of the recesses 140.

Each columnar element 60C extends over both the recess 140 and the through hole 710C. An end portion of the main body of the columnar element 60C, adjacent to the terminal electrode 621, is preferably smaller in diameter than the other portion. A surface of the main body of the columnar element 60C having a varying diameter is in contact with the main body 700 of the cover 70C, and the terminal electrode 621 is exposed to the outside.

In the example illustrated in FIG. 23D, a cover 70D includes a plurality of through holes 710D provided in the main body 700. The through holes 710D are each provided with a terminal electrode 72D on the wall surface thereof. The first principal surface 701 of the main body 700 includes terminal electrodes 71 provided thereon. The terminal electrodes 71 are each connected by an interlayer connecting electrode 73 to the corresponding terminal electrode 72D.

A columnar element 60D includes a routing electrode 624 adjacent to an end surface of the main body thereof. The columnar element 60D also includes a terminal electrode 623 on a side surface (circular periphery) adjacent to the end surface of the main body thereof. The terminal electrode 623 is connected by the routing electrode 624 to a circuit element (not shown) provided in the columnar element 60D. The columnar element 60D extends over both of the recess 140 and the through hole 710D. The diameter of the through hole 710D is preferably the same or substantially the same as the diameter of one end portion of the columnar element 60D. Thus, the terminal electrode 623 of the columnar element 60D is in plane contact with, and connected to, the terminal electrode 72D of the cover 70D.

In the example illustrated in FIG. 23E, a cover 70E includes a plurality of through holes 710E provided in the main body 700. The diameter of the through holes 710D is preferably larger than the diameter of the recesses 140 of the dielectric portion 20F. The plurality of through holes 710E overlap the respective recesses 140 of the dielectric portion 20F.

An end portion of the main body of the columnar element 60E, adjacent to the terminal electrode 621, is preferably larger in diameter than the other portion. This diameter is preferably larger than the diameter of the recess 140 and smaller than the diameter of the through hole 710E. A surface of the main body of the columnar element 60E having a varying diameter is in contact with the first principal surface 201 of the dielectric portion 20F.

Figure 24:
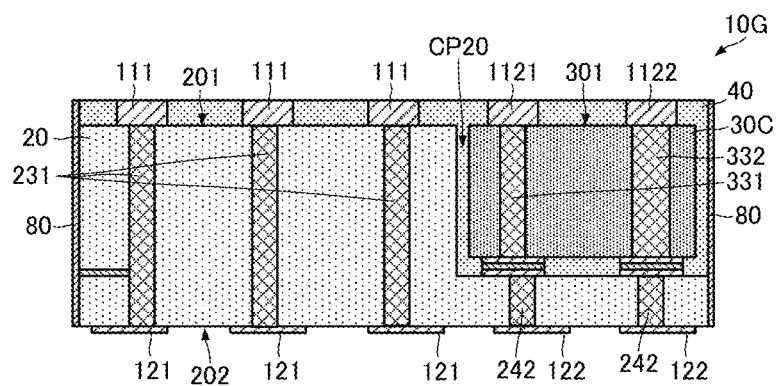
FIG. 24 is a lateral cross-sectional view illustrating a configuration of an interposer substrate according to a ninth preferred embodiment of the present invention.
Figure 25:
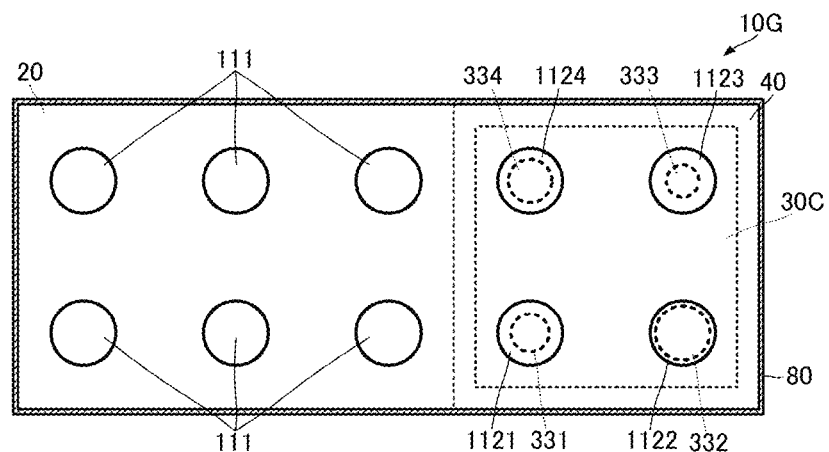
FIG. 25 is a plan view illustrating the configuration of the interposer substrate according to the ninth preferred embodiment of the present invention.

An interposer substrate according to a ninth preferred embodiment of the present invention will now be described with reference to the drawings. FIG. 24 is a lateral cross-sectional view illustrating a configuration of an interposer substrate according to the ninth preferred embodiment of the present invention. FIG. 25 is a plan view illustrating the configuration of the interposer substrate according to the ninth preferred embodiment of the present invention.

An interposer substrate 10G according to the ninth preferred embodiment differs from the interposer substrate 10 according to the first preferred embodiment in that it includes a shield film 80. The remaining configurations of the interposer substrate 10G are the same or substantially the same as those of the interposer substrate 10, and the description of the same or substantially the same portions will be omitted.

As illustrated in FIG. 24 and FIG. 25, the interposer substrate 10G includes the shield film 80. The shield film 80 is preferably made of, for example, metal. The shield film 80 is connected to the connecting electrodes 231 for grounding.

The shield film 80 covers the periphery of the interposer substrate 10G continuously along the entire or substantially the entire perimeter. The shield film 80 also covers the interposer substrate 10G entirely or substantially entirely in the height direction.

This configuration reduces emission of noise generated or propagating inside the interposer substrate 10G. Even when another surface-mount electronic component is disposed near the interposer substrate 10G, propagation of noise to the surface-mount electronic component is reduced. Conversely, leakage of noise from an external unit into the interposer substrate 10G is reduced.

The configuration of the interposer substrate 10G also reduces entry of external magnetic flux into the interposer substrate 10G.

The shield film 80 may preferably cover each principal surface connecting to the periphery of the interposer substrate 10G. It is only necessary in this case that the shield film 80 be connected to none of the electrodes, except those for grounding.

Figure 26:
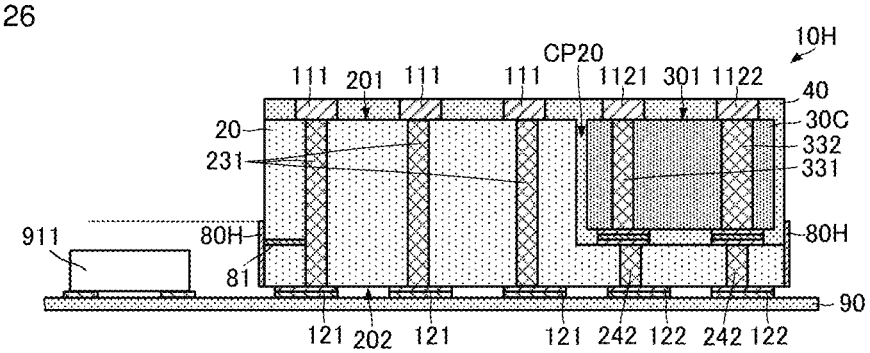
FIG. 26 is a lateral cross-sectional view illustrating a configuration of an interposer substrate according to a tenth preferred embodiment of the present invention.

An interposer substrate according to a tenth preferred embodiment of the present invention will now be described with reference to the drawings. FIG. 26 is a lateral cross-sectional view illustrating a configuration of an interposer substrate according to the tenth preferred embodiment of the present invention.

An interposer substrate 10H according to the tenth preferred embodiment differs from the interposer substrate 10G according to the ninth preferred embodiment in the shape of a shield film 80H. The remaining configurations of the interposer substrate 10H are the same or substantially the same as those of the interposer substrate 10G, and the description of the same or substantially the same portions will be omitted.

As illustrated in FIG. 26, in the interposer substrate 10H, the shield film 80H is provided partially in the height direction of the interposer substrate 10H. Specifically, in the example of FIG. 26, the shield film 80H is provided within the range of a predetermined height with respect to the second principal surface of the interposer substrate 10H. This height is preferably greater than the height of the surface-mount electronic component 911 mounted near the interposer substrate 10H.

This configuration also reduces propagation of noise to a surface-mount electronic component near the interposer substrate 10H. Conversely, leakage of noise from the surface-mount electronic component into the interposer substrate 10H is reduced.

Figure 27:
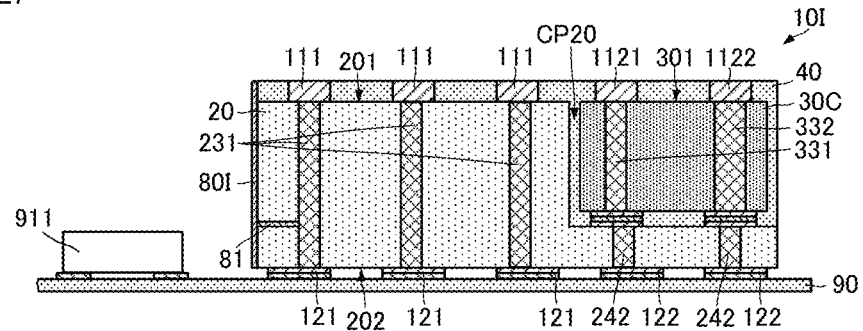
FIG. 27 is a lateral cross-sectional view illustrating a configuration of an interposer substrate according to an eleventh preferred embodiment of the present invention.

An interposer substrate according to an eleventh preferred embodiment of the present invention will now be described with reference to the drawings. FIG. 27 is a lateral cross-sectional view illustrating a configuration of an interposer substrate according to the eleventh preferred embodiment of the present invention.

An interposer substrate 10I according to the eleventh preferred embodiment differs from the interposer substrate 10G according to the ninth preferred embodiment in the shape of a shield film 80I. The remaining configurations of the interposer substrate 10I are the same or substantially the same as those of the interposer substrate 10G, and the description of the same or substantially the same portions will be omitted.

As illustrated in FIG. 27, in the interposer substrate 10I, the shield film 80I is provided on a side surface adjacent to the surface-mount electronic component 911 near the interposer substrate 10H.

This configuration also reduces propagation of noise to a surface-mount electronic component near the interposer substrate 10I. Conversely, leakage of noise from the surface-mount electronic component into the interposer substrate 10I is reduced.

Although the function of a ferrite bead element is included in the interposer substrate in the preferred embodiments described above, the configurations described above are applicable to any element that provides its function using a coil including a magnetic body, such as a common mode choke coil or a low-frequency noise filter, for example.

Although no specific examples of an electrode pattern in the dielectric portion are shown in the preferred embodiments described above, the electrode pattern may be one that is simply designed for transmission, or may be one that defines a circuit, such as a filter, for example.

Although a flat cable is used in the preferred embodiments described above, the configurations described above are applicable to other cables, circuit boards, and circuit components directly connected to the interposer substrate using a conductive joining material, such as solder, and similar operational advantages are achieved.

Some of the configurations of the preferred embodiments described above may be combined as appropriate. Operational advantages depending on the combination are achieved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An interposer substrate comprising:
  a base body including a dielectric portion and a magnetic portion, the base body including a first principal surface and a second principal surface opposite to each other;
  a plurality of connection terminal electrodes on the first principal surface of the base body and connected to an external unit;
  a plurality of circuit-board terminal electrodes on the second principal surface of the base body and connected to a circuit board; and
  a plurality of wiring electrodes inside the base body and connecting the plurality of connection terminal electrodes to the plurality of circuit-board terminal electrodes; wherein
  the plurality of wiring electrodes include:
    a first wiring electrode passing through only the dielectric portion; and
    a second wiring electrode passing through the magnetic portion;
  the dielectric portion includes a recess recessed from the first principal surface;
  the magnetic portion is mounted in the recess;
  the plurality of connection terminal electrodes include a first connection terminal electrode connected to the first wiring electrode and a second connection terminal electrode connected to the second wiring electrode;
  the first connection terminal electrode and the second connection terminal electrode are flush or substantially flush with each other on the first principal surface of the base body;
  the magnetic portion includes a plurality of the second wiring electrodes;

at least one of the plurality of second wiring electrodes has an impedance different from those of others of the plurality of second wiring electrodes; and end portions of the plurality of second wiring electrodes are rotationally symmetrically arranged as viewed from the first principal surface or the second principal surface.

2. The interposer substrate according to claim 1, wherein the recess is filled with an insulating resin portion.

3. The interposer substrate according to claim 1, wherein the dielectric portion includes a plurality of dielectric ceramic layers that are stacked; and the magnetic portion includes a plurality of magnetic ceramic layers that are stacked.

4. The interposer substrate according to claim 1, wherein in the plurality of second wiring electrodes, an electrode provided inside the magnetic portion has a coil pattern.

5. The interposer substrate according to claim 1, wherein at least one of the first wiring electrode and the plurality of second wiring electrodes has a different impedance; and an end portion of the first wiring electrode and the end portions of the plurality of second wiring electrodes are rotationally symmetrically arranged as viewed from the first principal surface or the second principal surface.

6. The interposer substrate according to claim 1, further comprising a shield film provided on a periphery of the base body to cover at least a portion of the periphery, the periphery connecting the first principal surface to the second principal surface.

7. The interposer substrate according to claim 6, wherein the shield film is continuously provided on the periphery along the entire or substantially the entire perimeter.

8. A circuit module comprising:

the interposer substrate according to claim 1;

a first circuit member including a plurality of external terminal electrodes joined to the plurality of connection terminal electrodes; and a circuit board including a plurality of land electrodes joined to the plurality of circuit-board terminal electrodes.

9. The circuit module according to claim 8, wherein of the plurality of external terminal electrodes, an external terminal electrode connected to the first wiring electrode is used for high-frequency signals or for grounding; and an external terminal electrode connected to at least one of the plurality of second wiring electrodes is used for low-frequency signals.

10. A circuit module comprising:

the interposer substrate according to claim 6;

a first circuit member including a plurality of external terminal electrodes joined to the plurality of connection terminal electrodes;

a circuit board including a plurality of land electrodes joined to the plurality of circuit-board terminal electrodes; and a surface-mount electronic component mounted on the circuit board; wherein a height of the shield film is greater than a height of the surface-mount electronic component.

11. The interposer substrate according to claim 1, wherein the magnetic portion includes a first principal surface and a second principal surface opposite to each other; and at least one of the plurality of second wiring electrodes passing through the magnetic portion extends from the first principal surface of the magnetic portion to the second principal surface of the magnetic portion in a direction parallel or substantially parallel to a thickness direction of the magnetic portion.

12. An interposer substrate comprising:

a base body including a dielectric portion and a magnetic portion, the base body including a first principal surface and a second principal surface opposite to each other;

a plurality of connection terminal electrodes on the first principal surface of the base body and connected to an external unit;

a plurality of circuit-board terminal electrodes on the second principal surface of the base body and connected to a circuit board; and a plurality of wiring electrodes inside the base body and connecting the plurality of connection terminal electrodes to the plurality of circuit-board terminal electrodes; wherein the plurality of wiring electrodes include:

a first wiring electrode passing through only the dielectric portion; and a second wiring electrode passing through the magnetic portion;

the dielectric portion includes a recess recessed from the first principal surface;

the interposer substrate further includes a columnar element including a terminal electrode and accommodated in the recess; and the columnar element defines at least one of the dielectric portion and the magnetic portion.

13. The interposer substrate according to claim 12, wherein the terminal electrode of the columnar element is exposed from the first principal surface of the base body and flush or substantially flush with the first principal surface.

14. The interposer substrate according to claim 12, further comprising:

a cover covering the first principal surface of the base body; wherein the cover includes a cover connecting electrode connecting the first wiring electrode and the terminal electrode of the columnar element to an external unit.

15. The interposer substrate according to claim 14, wherein the cover connecting electrode includes:

an inner terminal electrode provided on a surface of the cover adjacent to the base body and connected to the terminal electrode of the columnar element; and an outer terminal electrode connected to the inner terminal electrode and provided on a surface of the cover opposite the base body.

16. The interposer substrate according to claim 14, wherein the cover includes a through hole overlapping the recess; and the columnar element is inserted in the through hole.

17. The interposer substrate according to claim 12, wherein the recess includes on a bottom surface thereof an electrode, the electrode being connected to a circuit-board terminal electrode provided on the second principal surface of the base body and overlapping the recess in plan view; and a terminal electrode of the columnar element disposed adjacent to the second principal surface is connected to the electrode on the bottom surface of the recess.

18. The interposer substrate according to claim 12, wherein
the recess passes through the base body; and
a terminal electrode of the columnar element disposed adjacent to the second principal surface is exposed from the second principal surface.

19. An interposer substrate manufacturing method comprising the steps of:
forming a dielectric portion by stacking a plurality of dielectric ceramic layers, the dielectric portion including a first principal surface and a second principal surface opposite each other, the dielectric portion including a recess recessed from the first principal surface;
forming a magnetic portion including a plurality of magnetic ceramic layers stacked together;
forming a plurality of first columnar electrodes on the first principal surface of the dielectric portion;
mounting the magnetic portion in the recess;
forming a plurality of second columnar electrodes on a side of the magnetic portion adjacent to the first principal surface;
forming an insulating resin portion to cover the magnetic portion, the plurality of first columnar electrodes, and the plurality of second columnar electrodes from a side of the first principal surface; and
exposing the plurality of first columnar electrodes and the plurality of second columnar electrodes to an outside of the first principal surface by grinding at least the insulating resin portion.

* * * * *